United States Patent
Haruna et al.

(10) Patent No.: US 10,638,598 B2
(45) Date of Patent: Apr. 28, 2020

(54) GROUND MEMBER, SHIELDED PRINTED CIRCUIT BOARD, AND METHOD FOR MANUFACTURING SHIELDED PRINTED CIRCUIT BOARD

(71) Applicant: Tatsuta Electric Wire & Cable Co., Ltd., Osaka (JP)

(72) Inventors: Yuusuke Haruna, Kizugawa (JP); Takahiko Katsuki, Kizugawa (JP); Tsuyoshi Hasegawa, Kizugawa (JP); Hiroshi Tajima, Kizugawa (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 16/346,105

(22) PCT Filed: Feb. 9, 2018

(86) PCT No.: PCT/JP2018/004683
§ 371 (c)(1),
(2) Date: Apr. 29, 2019

(87) PCT Pub. No.: WO2018/147429
PCT Pub. Date: Aug. 16, 2018

(65) Prior Publication Data
US 2019/0261503 A1    Aug. 22, 2019

(30) Foreign Application Priority Data
Feb. 13, 2017    (JP) .................................. 2017-024501

(51) Int. Cl.
*H05K 1/02*    (2006.01)
*H01R 4/04*    (2006.01)
(Continued)

(52) U.S. Cl.
CPC ............. *H05K 1/0215* (2013.01); *H01R 4/04* (2013.01); *H01R 43/00* (2013.01); *H05K 1/02* (2013.01);
(Continued)

(58) Field of Classification Search
CPC ............... H05K 1/0215; H05K 1/0216; H05K 2201/0715; H01R 4/04
(Continued)

(56) References Cited

U.S. PATENT DOCUMENTS

2013/0092428 A1*    4/2013    Kawaguchi .......... H05K 1/0218
174/262
2014/0326484 A1*    11/2014    Tajima ................. H05K 1/0216
174/250
(Continued)

FOREIGN PATENT DOCUMENTS

JP    H03257769 A    11/1991
JP    H07157720 A    6/1995
(Continued)

OTHER PUBLICATIONS

International Search Report and Written Opinion dated May 15, 2018 for International Patent Application No. PCT/JP2018/004683.

*Primary Examiner* — Sherman Ng
(74) *Attorney, Agent, or Firm* — Potomac Law Group, PLLC; Kenneth Fagin

(57) ABSTRACT

The present invention aims to provide a ground member that can be mounted on any position, wherein misalignment is less likely to occur between conductive filler particles of the ground member and a shielding layer of a shielding film when a shielded printed wiring board including the ground member is repeatedly heated and cooled to mount components thereon. The ground member of the present invention includes: a conductive external connection member having (Continued)

a first main surface and a second main surface opposite to the first main surface; conductive filler particles disposed adjacent to the first main surface; and an adhesive resin for fixing the conductive filler particles to the first main surface, wherein each conductive filler particle includes a low-melting-point metal.

25 Claims, 8 Drawing Sheets

(51) Int. Cl.
H01R 43/00 (2006.01)
H05K 9/00 (2006.01)

(52) U.S. Cl.
CPC ............ *H05K 1/0216* (2013.01); *H05K 9/00* (2013.01); *H05K 2201/0715* (2013.01)

(58) Field of Classification Search
USPC ........................................................ 174/250
See application file for complete search history.

(56) References Cited

U.S. PATENT DOCUMENTS

| | | | |
|---|---|---|---|
| 2015/0008022 A1* | 1/2015 | Masui | H01B 1/22 174/257 |
| 2015/0009637 A1* | 1/2015 | Kawaguchi | H05K 9/0088 361/751 |
| 2015/0305144 A1* | 10/2015 | Tajima | B32B 7/02 174/350 |
| 2016/0007444 A1* | 1/2016 | Watanabe | H05K 1/0215 174/254 |
| 2016/0120077 A1* | 4/2016 | Watanabe | H05K 1/0216 174/377 |

FOREIGN PATENT DOCUMENTS

| | | |
|---|---|---|
| JP | 2002111154 A | 4/2002 |
| JP | 4201548 B2 | 12/2008 |
| JP | 2013152867 A | 8/2013 |
| JP | 2016029748 A | 3/2016 |

* cited by examiner

GROUND MEMBER, SHIELDED PRINTED CIRCUIT BOARD, AND METHOD FOR MANUFACTURING SHIELDED PRINTED CIRCUIT BOARD

CROSS-REFERENCE TO RELATED APPLICATIONS

This application is the U.S. National Phase of International Application Number PCT/JP2018/004683 filed Feb. 9, 2018, the contents of which are incorporated by reference and the priority benefit of which is claimed. The International Application, in turn, is based on Japanese Application JP 2017-024501 filed Feb. 13, 2017, the contents of which are incorporated by reference and the priority benefit of which is also claimed.

TECHNICAL FIELD

The present invention relates to ground members, shielded printed wiring boards, and methods for producing a shielded printed wiring board.

BACKGROUND ART

Flexible printed wiring boards are widely used to incorporate circuits into complicated mechanisms of electronic devices, such as mobile phones, video cameras, and notebook computers, which are rapidly becoming smaller with higher functionality. Owing to their excellent flexibility, flexible printed wiring boards are also used to connect a movable part such as a printer head to a control unit. These electronic devices require electromagnetic wave shielding, and flexible printed wiring boards for use in these devices are now increasingly provided with electromagnetic wave shielding (hereinafter such flexible printed wiring boards also referred to as "shielded printed wiring boards").

A common shielded printed wiring board usually includes a substrate film sequentially including a base film, a printed circuit, and an insulating film; and a shielding film including a conductive layer, a shielding layer laminated on the conductive layer, and an insulating layer laminated on the conductive layer, wherein the shielding film covers the substrate film such that the conductive layer is in contact with the substrate film.

The printed circuit includes a ground circuit, and the ground circuit is electrically connected to a chassis of an electronic device for grounding.

As described above, the substrate film of the shielded printed wiring board includes the insulating film on the printed circuit including the ground circuit. In addition, the substrate film is covered by the shielding film including the insulating layer.

Thus, it is required to form a hole in advance in a portion of the insulating film and a portion of the shielding film in order to electrically connect the ground circuit to the chassis of the electronic device.

This has been a factor that hinders printed circuit design flexibility.

Patent Literature 1 discloses a shielding film including a cover film formed by coating on one side of a separate film; a shielding layer including a metal thin layer and an adhesive layer provided on a surface of the cover film; and a ground member, wherein the ground member includes, on its one end, a projection connected to the shielding layer through the cover film by being pressed onto the cover film, and the other end of the ground member is exposed and formed connectable to its nearby ground portion.

In the production of the shielding film disclosed in Patent Literature 1, the ground member is pressured against the cover film such that the projection of the ground member penetrates through the cover film. Thus, the ground member can be mounted on any position of the shielding film.

Use of such a shielding film to produce a shielded printed wiring board makes it possible to electrically connect the ground circuit to the chassis of the electronic device at any position.

CITATION LIST

Patent Literature

Patent Literature 1: Japanese Patent No. 4201548

SUMMARY OF INVENTION

Technical Problem

The shielded printed wiring board is repeatedly heated and cooled in steps such as a reflow soldering step in order to mount components.

The shielded printed wiring board disclosed in Patent Literature 1 is repeatedly heated and cooled as described above when mounting components thereon. This procedure sometimes causes disconnection between the projection of the ground member and the shielding layer due to volumetric changes by thermal expansion and thermal contraction, thus increasing the resistance.

The present invention was made to solve the above problem, and aims to provide a ground member that can be mounted on any position, wherein misalignment is less likely to occur between conductive filler particles of the ground member and a shielding layer of a shielding film when a shielded printed wiring board including the ground member is repeatedly heated and cooled to mount components thereon.

Solution to Problem

Specifically, the ground member of the present invention includes: a conductive external connection member having a first main surface and a second main surface opposite to the first main surface; conductive filler particles disposed adjacent to the first main surface; and an adhesive resin for fixing the conductive filler particles to the first main surface, wherein the conductive filler particles contain a low-melting-point metal.

The ground member of the present invention is for use in a shielded printed wiring board including a substrate film and a shielding film.

First, the following describes the structure of the shielded printed wiring board.

In the shielded printed wiring board, the substrate film is a film sequentially including a base film, a printed circuit including a ground circuit, and an insulating film.

The shielding film is a film including a shielding layer and an insulating layer laminated on the shielding layer.

In the shielded printed wiring board, the shielding film covers the substrate film such that the shielding layer of the shielding film is closer to the substrate film than the insulating layer is.

The ground member of the present invention is mounted on the shielded printed wiring board by being pressured against the shielded printed wiring board such that the conductive filler particles of the ground member of the present invention penetrate the insulating layer of the shielding film.

When mounting the ground member of the present invention on the shielded printed wiring board as described above, the ground member of the present invention can be mounted on any position without forming a hole or the like in advance in the insulating layer of the shielding film of the shielded printed wiring board.

In the ground member of the present invention, each conductive filler particle contains a low-melting-point metal.

Heating is performed when mounting the ground member of the present invention on the shielded printed wiring board and in a component mounting step of mounting components on the shielded printed wiring board after the ground member is mounted. The heating softens the low-melting-point metal, thus improving adhesion between an external connection member and the conductive filler particles of the ground member, and adhesion between the conductive filler particles of the ground member and the shielding layer of the shielding film.

In the ground member of the present invention, preferably, the conductive filler particles each include a core particle and a low-melting-point metal layer made of the low-melting-point metal formed on at least a portion of a surface of each core particle.

When the conductive filler particles include core particles, the core particles are not easily softened by heating. Thus, pressurizing under heating allows the conductive filler particles of the ground member to easily penetrate the insulating layer of the shielding film.

Thus, even when a shielded printed wiring board including the ground member of the present invention is repeatedly heated and cooled to mount components thereon, misalignment is less likely to occur between the external connection member and the core particles of the ground member and between the core particles of the ground member and the shielding layer of the shielding film.

In the ground member of the present invention, preferably, the core particles have an average particle size of 1 to 200 μm.

If the core particles have an average particle size less than 1 μm, the conductive filler particles will not easily penetrate the insulating layer of the shielding film.

If the core particles have an average particle size exceeding 200 μm, the conductive filler particles will be large. Thus, a large amount of pressure will be required to allow the conductive filler particles to penetrate the insulating layer of the shielding film when mounting the ground member on the shielded printed wiring board.

In the ground member of the present invention, preferably, each core particle includes at least one selected from the group consisting of copper powder, silver powder, nickel powder, silver-coated copper powder, gold-coated copper powder, silver-coated nickel powder, gold-coated nickel powder, nickel-coated copper powder, nickel-coated silver powder, and metal-coated resin particles.

These particles have excellent conductivity, and are thus suitable as the core particles.

In the ground member of the present invention, preferably, the low-melting-point metal layer has a thickness of 0.1 to 50 μm.

If the low-melting-point metal layer has a thickness less than 0.1 μm, since the amount of the metal constituting the low-melting-point metal layer is small, it will be difficult to improve adhesion between the external connection member and the core particles of the ground member, and adhesion between the core particles of the ground member and the shielding layer of the shielding film when mounting the ground member on the shielded printed wiring board.

If the low-melting-point metal layer has a thickness exceeding 50 μm, since the low-melting-point metal layer is thick, the conductive filler particles of the ground member will be large. Thus, a large amount of pressure will be required to allow the conductive filler particles to penetrate the insulating layer of the shielding film when mounting the ground member on the shielded printed wiring board.

In the ground member of the present invention, preferably, the low-melting-point metal layer contains a flux.

The presence of the flux in the low-melting-point metal layer facilitates adhesion of the metal constituting the low-melting-point metal layer to the external connection member, the core particles, the shielding layer of the shielding film and/or the adhesive layer of the shielding film when the metal constituting the low-melting-point metal layer is softened.

As a result, it is possible to improve adhesion between the external connection member and the core particles of the ground member, and adhesion between the core particles of the ground member and the shielding layer of the shielding film.

In the ground member of the present invention, the conductive filler particles may be surrounded by the adhesive resin.

Such a ground member can be easily produced simply by applying a mixture of the conductive filler particles and the adhesive resin to the first main surface of the external connection member.

In the ground member of the present invention, at least a portion of the conductive filler particles may be exposed from the adhesive resin.

When at least a portion of the conductive filler particle is exposed from the adhesive resin, the conductive filler particles can be rendered electrically conductive through such exposed portions. Thus, when such a ground member is used in the shielded printed wiring board, the conductive filler particles of the ground member can be easily electrically connected to the shielding layer of the shielding film.

In the ground member of the present invention, preferably, the low-melting-point metal has a melting point of 300° C. or lower.

If the low-melting-point metal layer is made of a metal having a melting point of 300° C. or lower, the low-melting-point metal layer is easily softened when mounting the ground member on the shielded printed wiring board, making it possible to suitably improve adhesion between the core particles of the ground member and the shielding layer of the shielding film.

If the low-melting-point metal layer is made of a metal having a melting point higher than 300° C., a high heating temperature is required to mount the ground member on the shielded printed wiring board, so that the ground member and the shielded printed wiring board may be susceptible to thermal damage.

In the ground member of the present invention, preferably, the external connection member contains at least one selected from the group consisting of copper, aluminum, silver, gold, nickel, chromium, titanium, zinc, and stainless steel.

These materials are suitable for electrical connection between the ground member and an external ground.

In the ground member of the present invention, preferably, the second main surface includes a corrosion resistant layer formed thereon.

The corrosion resistant layer formed on the second main surface of the ground member can prevent corrosion of the ground member.

In the ground member of the present invention, preferably, the corrosion resistant layer contains at least one selected from the group consisting of nickel, gold, silver, platinum, palladium, rhodium, iridium, ruthenium, osmium, and alloys thereof.

These materials are less likely to corrode. Thus, these materials are suitable for the corrosion resistant layers of the ground member of the present invention.

The shielded printed wiring board of the present invention includes: a substrate film sequentially including a base film, a printed circuit including a ground circuit, and an insulating film; a shielding film including a shielding layer and an insulating layer laminated on the shielding layer, the shielding film covering the substrate film such that the shielding layer is closer to the substrate film than the insulating layer is; and a ground member mounted on the insulating layer of the shielding film, the ground member including: a conductive external connection member having a first main surface and a second main surface opposite to the first main surface; conductive filler particles disposed adjacent to the first main surface; and an adhesive resin for fixing the conductive filler particles to the first main surface, wherein the conductive filler particles include a low-melting-point metal, the conductive filler particles of the ground member are disposed penetrating the insulating layer of the shielding film, the low-melting-point metal in the conductive filler particles of the ground member is connected to the shielding layer of the shielding film, and the external connection member of the ground member is electrically connectable to an external ground.

The shielded printed wiring board of the present invention includes a ground member including a conductive external connection member having a first main surface and a second main surface opposite to the first main surface; conductive filler particles disposed adjacent to the first main surface; and an adhesive resin for fixing the conductive filler particles to the first main surface, wherein the conductive filler particles include a low-melting-point metal. In other words, the shielded printed wiring board of the present invention includes the ground member of the present invention.

Thus, even when the shielded printed wiring board of the present invention is repeatedly heated and cooled to mount components thereon, misalignment is less likely to occur between the external connection member and the conductive filler particles of the ground member, and between the conductive filler particles of the ground member and the shielding layer of the shielding film.

In the shielded printed wiring board of the present invention, preferably, each conductive filler particle includes a core particle and a low-melting-point metal layer made of the low-melting-point metal formed on at least a portion of a surface of each core particle.

When the conductive filler particles include core particles, the core particles are not easily softened by heating. Thus, pressurizing under heating allows the conductive filler particles of the ground member to easily penetrate the insulating layer of the shielding film.

Thus, even when the shielded printed wiring board of the present invention is repeatedly heated and cooled to mount components thereon, misalignment is less likely to occur between the external connection member and the core particles of the ground member, and between the core particles of the ground member and the shielding layer of the shielding film.

In the shielded printed wiring board of the present invention, preferably, the shielding film includes an adhesive layer, the shielding layer laminated on the adhesive layer, and the insulating layer laminated on the shielding layer, and the adhesive layer of the shielding film is in contact with the substrate film.

The presence of the adhesive layer in the shielding film can facilitate adhesion of the shielding film to the substrate film during production of the shielded printed wiring board.

In the shielded printed wiring board of the present invention, preferably, the adhesive layer of the shielding film is a conductive adhesive layer.

When the adhesive layer of the shielding film is a conductive adhesive layer, penetration of the conductive filler particles of the ground member through the insulating layer of the shielding film brings the conductive filler particles of the ground member into contact with the conductive adhesive layer and allows the external connection member of the ground member to be electrically connected to the ground circuit of the substrate film.

In the shielded printed wiring board of the present invention, preferably, the shielding layer of the shielding film is made of metal.

The metal suitably functions as a shielding layer to block electromagnetic waves.

In the shielded printed wiring board of the present invention, preferably, the shielding film includes a shielding film low-melting-point metal layer between the adhesive layer and the shielding layer and/or between the shielding layer and the insulating layer, and the shielding film low-melting-point metal layer is connected to the conductive filler particles of the ground member.

Such a structure can improve adhesion between the conductive filler particles of the ground member and the shielding layer of the shielding film, and between the conductive filler particles of the ground member and the adhesive layer of the shielding film.

In the shielded printed wiring board of the present invention, the shielding layer of the shielding film may be a conductive adhesive layer, and the conductive adhesive layer of the shielding film may be in contact with the substrate film.

The shielding layer, which is a conductive adhesive layer, has functions to allow the shielding film to adhere to the substrate film and to block electromagnetic waves.

In the shielded printed wiring board of the present invention, preferably, the shielding film includes a shielding film low-melting-point metal layer between the shielding layer and the insulating layer, and the shielding film low-melting-point metal layer is connected to the conductive filler particles of the ground member.

Such a structure can improve adhesion between the core particles of the ground member and the shielding layer of the shielding film.

The method for producing a shielded printed wiring board of the present invention is a method for producing a shielded printed wiring board including: a substrate film sequentially including a base film, a printed circuit including a ground circuit, and an insulating film; a shielding film including a shielding layer and an insulating layer laminated on the shielding layer; and the ground member of the present invention mounted on the insulating layer of the shielding film, the method including: a shielding film placing step of placing the shielding film on the substrate film such that the shielding layer of the shielding film is closer to the substrate film than the insulating layer of the shielding film is; a ground member mounting step of mounting the ground member on the shielding film such that the conductive filler particles of the ground member face the insulating layer of the shielding film; a pressurizing step of applying pressure to the ground member such that the conductive filler particles of the ground member penetrate the insulating layer of the shielding film; and a heating step of heat-softening the low-melting-point metal of the ground member to connect the low-melting-point metal of the ground member to the shielding layer of the shielding film.

The shielded printed wiring board of the present invention can be produced with the use of the ground member of the present invention.

In the method for producing a shielded printed wiring board of the present invention, the pressurizing step and the heating step may be simultaneously performed.

The production efficiency can be improved by simultaneously performing these steps.

In the method for producing a shielded printed wiring board of the present invention, preferably, the shielding film includes an adhesive layer, the shielding layer laminated on the adhesive layer, and the insulating layer laminated on the shielding layer.

The presence of the adhesive layer in the shielding film can facilitate adhesion of the shielding film to the substrate film in the shielding film placing step.

In the method for producing a shielded printed wiring board of the present invention, preferably, the adhesive layer of the shielding film is a conductive adhesive layer.

When the adhesive layer of the shielding film is a conductive adhesive layer, the conductive filler particles of the ground member can be brought into contact with the conductive adhesive layer by allowing the conductive filler particles of the ground member to penetrate the insulating layer of the shielding film, making it possible to electrically connect the external connection member of the ground member to the ground circuit of the substrate film.

In the method for producing a shielded printed wiring board of the present invention, preferably, the shielding layer of the shielding film is made of metal.

The metal suitably functions as a shielding layer to block electromagnetic waves.

In the method for producing a shielded printed wiring board of the present invention, preferably, the shielding film includes a shielding film low-melting-point metal layer between the adhesive layer and the shielding layer and/or between the shielding layer and the insulating layer, and in the heating step, the shielding film low-melting-point metal layer is softened to be connected to the core particles of the ground member.

This makes it possible to improve adhesion between the core particles of the ground member and the shielding layer of the shielding film, and adhesion between the core particles of the ground member and the adhesive layer of the shielding film.

In the method for producing a shielded printed wiring board of the present invention, the shielding layer of the shielding film may be a conductive adhesive layer.

The shielding layer, which is a conductive adhesive layer, has functions to allow the shielding film to adhere to the substrate film and to block electromagnetic waves.

In the method for producing a shielded printed wiring board of the present invention, preferably, the shielding film includes a shielding film low-melting-point metal layer between the shielding layer and the insulating layer, and in the heating step, the shielding film low-melting-point metal layer is softened to be connected to the core particles of the ground member.

This makes it possible to improve adhesion between the conductive filler particles of the ground member and the core particles of the shielding film.

Advantageous Effects of Invention

When mounting the ground member of the present invention on the shielded printed wiring board, the ground member of the present invention can be mounted on any position without forming a hole or the like in advance in the insulating layer of the shielding film of the shielded printed wiring board.

In addition, when a shielded printed wiring board including the ground member of the present invention is repeatedly heated and cooled to mount components thereon, misalignment can be prevented from occurring between the external connection member and the conductive filler particles of the ground member, and between the conductive filler particles of the ground member and the shielding layer of the shielding film.

The ground member of the present invention is specifically described below. However, the present invention is not limited to the following embodiments, and can be appropriately modified without changing the gist of the invention.

First Embodiment

The following describes a ground member according to a first embodiment of the present invention.

Figure 1:
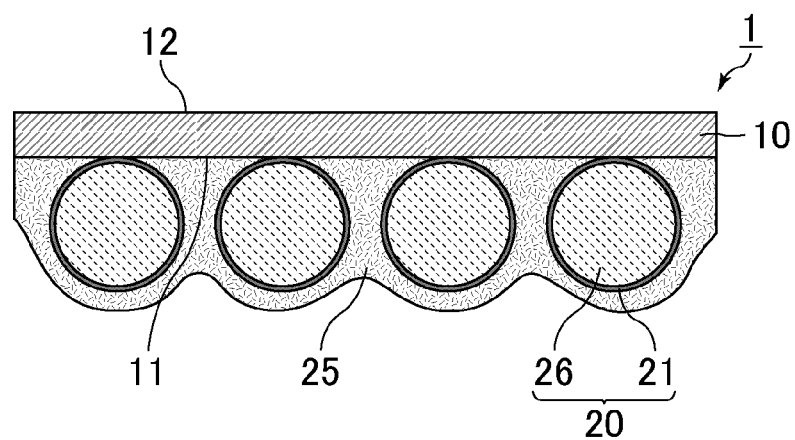
FIG. 1 is a cross-sectional view schematically showing an exemplary ground member of the present invention.

FIG. 1 is a cross-sectional view schematically showing an exemplary ground member of the present invention.

As shown in FIG. 1, a ground member 1 includes a conductive external connection member 10 having a first main surface 11 and a second main surface 12 opposite to the first main surface 11.

The ground member 1 also includes conductive filler particles 20 fixed to the first main surface 11 by an adhesive resin 25.

The conductive filler particles 20 each include a core particle 26 and a low-melting-point metal layer 21 formed on at least a portion of a surface of the core particle 26.

Further, in the ground member 1, the conductive filler particles 20 are surrounded by the adhesive resin 25.

The ground member 1 is for use in a shielded printed wiring board including a substrate film and a shielding film.

First, the following describes the structure of the shielded printed wiring board with reference to the drawings.

Figure 2:
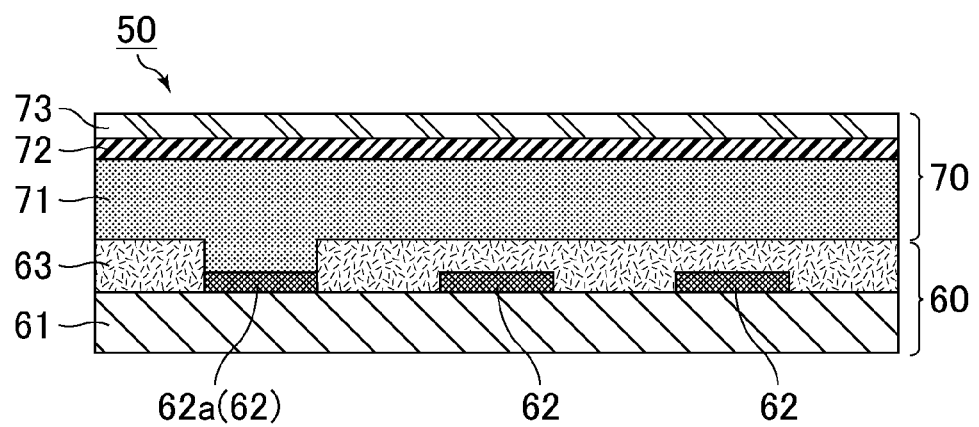
FIG. 2 is a cross-sectional view schematically showing an exemplary shielded printed wiring board in which the ground member of the present invention is to be used.

FIG. 2 is a cross-sectional view schematically showing an exemplary shielded printed wiring board in which the ground member of the present invention is to be used.

As shown in FIG. 2, a shielded printed wiring board 50 includes a substrate film 60 and a shielding film 70.

In the shielded printed wiring board 50, the substrate film 60 is a film sequentially including a base film 61, a printed circuit 62 including a ground circuit 62a, and an insulating film 63.

The shielding film 70 is a film including an adhesive layer 71, a shielding layer 72 laminated on the adhesive layer 71, and an insulating layer 73 laminated on the shielding layer 72.

In the shielded printed wiring board 50, the shielding film 70 covers the substrate film 60 such that the adhesive layer 71 of the shielding film 70 is in contact with the substrate film 60.

The adhesive layer 71 of the shielding film 70 is a conductive adhesive layer.

Next, the following describes a case where the ground member 1 is used in the shielded printed wiring board 50 with reference to the drawings.

Figure 3A:
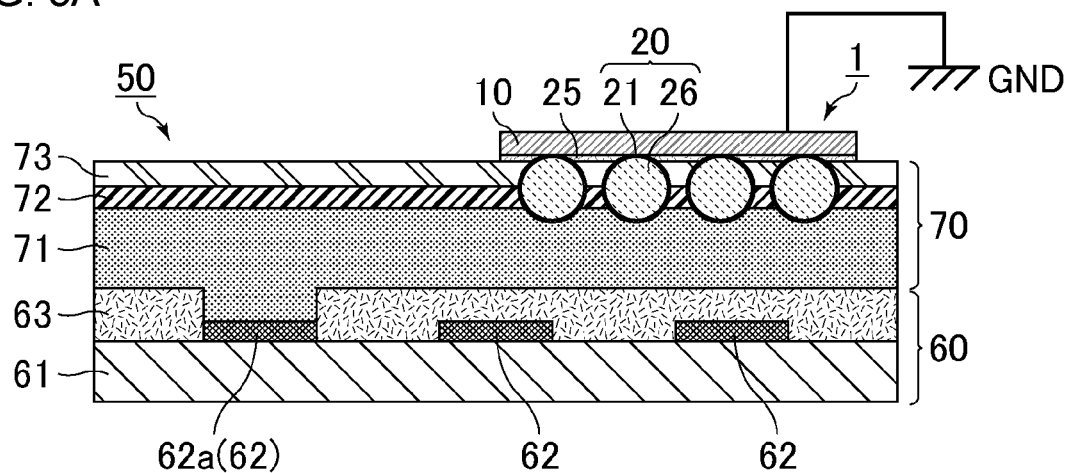
FIGS. 3A and 3B are schematic views each schematically showing an example where the ground member of the present invention is included in a shielded printed wiring board.
Figure 3B:
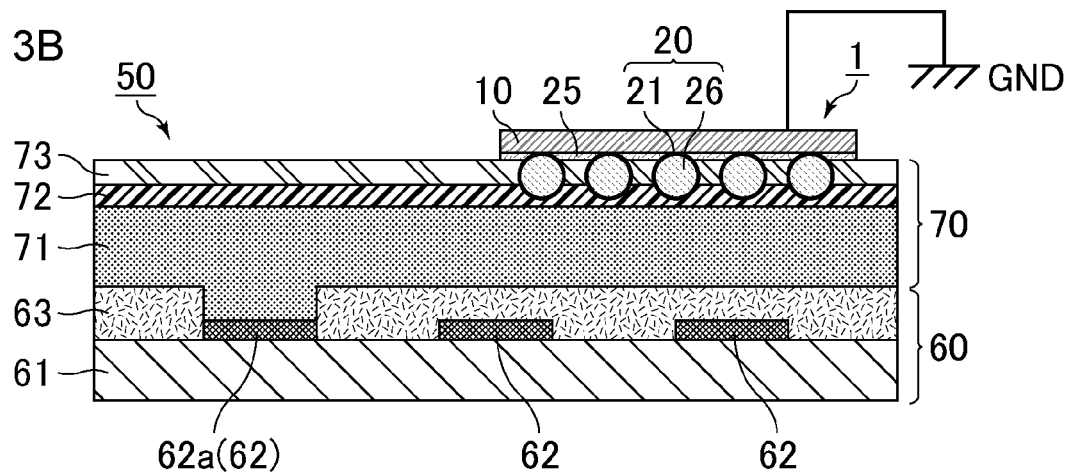

FIGS. 3A and 3B are schematic views each schematically showing an example where the ground member of the present invention is used in a shielded printed wiring board.

As shown in FIGS. 3A and 3B, the ground member 1 is mounted by being pressured against the shielded printed wiring board 50 such that the conductive filler particles of the ground member 1 penetrate the insulating layer 73 of the shielding film 70.

A pressure is applied to the ground member 1 such that the conductive filler particles 20 of the ground member 1 penetrate the shielding layer 72 of the shielding film 70, so that the conductive filler particles 20 of the ground member 1 may be brought into contact with the adhesive layer 71 of the shielding film 70 as shown in FIG. 3A or so that the conductive filler particles 20 of the ground member 1 may be brought into contact only with the shielding layer 72 of the shielding film 70 as shown in FIG. 3B.

Since the adhesive layer 71 is a conductive adhesive layer, it is possible to electrically connect the external connection member 10 of the ground member 1 to the ground circuit 62a of the substrate film 60 by bringing the conductive filler particles 20 into contact with the adhesive layer 71 and the shielding layer 72 or into only contact with the shielding layer 72.

The external connection member 10 of the ground member 1 is to be connected to an external ground GND.

Since the ground member 1 is mounted on the shielded printed wiring board 50 as described above, the ground member 1 can be mounted on any position without forming a hole or the like in advance in the insulating layer 73 of the shielding film 70 of the shielded printed wiring board 50.

In the ground member 1, each core particle 26 includes the low-melting-point metal layer 21 formed on its surface.

Heating is performed when mounting the ground member 1 on the shielded printed wiring board 50 and in the component mounting step after the ground member is mounted. The heating softens the low-melting-point metal layer 21, thus improving adhesion between the core particles 26 of the ground member 1 and the shielding layer 72 of the shielding film 70, and adhesion between the core particles 26 of the ground member 1 and the adhesive layer 71 of the shielding film 70. Thus, even when the shielded printed wiring board 50 including the ground member 1 is repeatedly heated and cooled to mount components thereon, misalignment is less likely to occur between the core particles 26 of the ground member 1 and the shielding layer 72 and/or the adhesive layer 71 of the shielding film 70. As a result, an increase in electrical resistance between the ground circuit 62a of the substrate film 60 and an external ground GND can be suppressed.

In the case where the metal constituting the shielding layer 72 and the metal constituting the low-melting-point metal layer 21 of the core particles 26 can form an alloy, the formation of the alloy further improves adhesion between the core particles 26 of the ground member 1 and the shielding layer 72 of the shielding film 70.

The low-melting-point metal layer 21 may be softened in the step of mounting components on the shielded printed wiring board after the conductive filler particles 20 of the ground member 1 are connected to the shielding layer 72.

For example, if solder is used to mount components, a reflow soldering step will be involved. In this case, the low-melting-point metal layer 21 can be softened by heat of reflow soldering.

In the ground member 1, preferably, the low-melting-point metal layer 21 has a melting point of 300° C. or lower.

If the low-melting-point metal layer 21 is made of a metal having a melting point of 300° C. or lower, the low-melting-point metal layer 21 is easily softened when mounting the ground member 1 on the shielded printed wiring board 50, making it possible to suitably improve adhesion between the core particles 26 of the ground member 1 and the shielding layer 72 and/or the adhesive layer 71 of the shielding film 70.

If the low-melting-point metal layer 21 is made of a metal having a melting point higher than 300° C., a high heating temperature is required to mount the ground member 1 on the shielded printed wiring board 50, so that the ground member 1 and the shielded printed wiring board 50 may be susceptible to thermal damage.

In the ground member 1, the metal contained in the low-melting-point metal layer 21 is not limited, but the metal preferably includes at least one selected from the group consisting of indium, tin, lead, and bismuth.

These metals have melting points and conductivity suitable to form the low-melting-point metal layer 21.

In the ground member 1, preferably, the low-melting-point metal layer 21 has a thickness of 0.1 to 50 μm.

If the low-melting-point metal layer 21 has a thickness less than 0.1 μm, since the amount of the metal constituting the low-melting-point metal layer 21 is small, it will be difficult to improve adhesion between the external connection member 10 and the core particles 26 of the ground member 1, adhesion between the core particles 26 of the ground member 1 and the shielding layer 72 of the shielding film 70, and adhesion between the core particles 26 of the ground member 1 and the adhesive layer 71 of the shielding film 70 when mounting the ground member 1 on the shielded printed wiring board 50.

If the low-melting-point metal layer 21 has a thickness exceeding 50 μm, since the low-melting-point metal layer 21 is thick, the conductive filler particles 20 of the ground member 1 will be large. Thus, a large amount of pressure will be required to allow the conductive filler particles 20 to penetrate the insulating layer 73 of the shielding film 70 when mounting the ground member 1 on the shielded printed wiring board 50.

In the ground member 1, the low-melting-point metal content in the low-melting-point metal layer 21 is preferably 6 wt % or more, more preferably 7 wt % or more, still more preferably 8 wt % or more relative to the total amount of the conductive filler particles 20.

If the low-melting-point metal content is less than 6 wt %, since the amount of the low-melting-point metal constituting the low-melting-point metal layer 21 is small, it will be difficult to improve adhesion between the external connection member 10 and the conductive filler particles 20 of the ground member 1, and adhesion between the conductive filler particles 20 of the ground member 1 and the shielding layer 72 of the shielding film 70 when mounting the ground member 1 on the shielded printed wiring board 50.

In addition, in the ground member 1, the low-melting-point metal content in the low-melting-point metal layer 21 is preferably 80 wt % or less, more preferably 78 wt % or less relative to the total amount of the conductive filler particles 20.

If the low-melting-point metal content exceeds 80 wt %, since the low-melting-point metal layer 21 is thick, the conductive filler particles 20 of the ground member 1 will be large. Thus, a large amount of pressure will be required to allow the conductive filler particles 20 to penetrate the insulating layer 73 of the shielding film 70 when mounting the ground member 1 on the shielded printed wiring board 50.

In addition, as described later, the ground member 1 is heated when mounting the ground member 1 on the shielded printed wiring board 50. If the low-melting-point metal content exceeds 80 wt %, the low-melting-point metal layer 21 may be excessively softened by the heating. Thus, the position of the ground member 1 is easily misaligned.

In the ground member 1, preferably, the low-melting-point metal layer 21 contains a flux.

The presence of the flux in the low-melting-point metal layer 21 facilitates adhesion of the metal constituting the low-melting-point metal layer 21 to the external connection member 10, the core particles 26, the shielding layer 72 of the shielding film 70 and/or the adhesive layer 71 of the shielding film 70 when the metal constituting the low-melting-point metal layer 21 is softened.

As a result, it is possible to improve adhesion between the external connection member 10 and the core particles 26 of the ground member 1, adhesion between the core particles 26 of the ground member 1 and the shielding layer 72 of the shielding film 70, and adhesion between the core particles 26 of the ground member 1 and the adhesive layer 71 of the shielding film 70.

Any known flux can be used. Examples include polyvalent carboxylic acid, lactic acid, citric acid, oleic acid, stearic acid, glutamic acid, benzoic acid, glycerol, and rosin.

In the ground member 1, the adhesive resin 25 may be any adhesive resin, but it is preferably an acrylic resin, an epoxy resin, a silicone resin, a thermoplastic elastomer resin, a rubber resin, a polyester resin, a urethane resin, or the like.

These adhesive resins have excellent adhesion.

In the ground member 1, preferably, the external connection member 10 contains at least one selected from the group consisting of copper, aluminum, silver, gold, nickel, chromium, titanium, zinc, and stainless steel.

These materials are suitable for electrical connection between the ground member 1 and an external ground GND.

In the ground member 1, preferably, the second main surface 12 includes a corrosion resistant layer formed thereon.

The corrosion resistant layer formed on the second main surface 12 of the ground member 1 can prevent corrosion of the ground member 1.

In the ground member 1, preferably, the corrosion resistant layer contains at least one selected from the group consisting of nickel, gold, silver, platinum, palladium, rhodium, iridium, ruthenium, osmium, and alloys thereof.

These materials are less likely to corrode. Thus, these materials are suitable for the corrosion resistant layers of the ground member 1.

In the ground member 1, preferably, the core particles 26 have an average particle size of 1 to 200 μm.

If the core particles 26 have an average particle size less than 1 μm, the conductive filler particles 20 will be small. As a result, the conductive filler particles 20 cannot easily penetrate the insulating layer 73 of the shielding film 70 when mounting the ground member 1 on the shielded printed wiring board 50.

If the core particles 26 have an average particle size exceeding 200 μm, the conductive filler particles 20 will be large. Thus, a large amount of pressure will be required to allow the conductive filler particles 20 to penetrate the insulating layer 73 of the shielding film 70 when mounting the ground member 1 on the shielded printed wiring board 50.

In the ground member 1, preferably, each core particle 26 includes at least one selected from the group consisting of copper powder, silver powder, nickel powder, silver-coated copper powder, gold-coated copper powder, silver-coated nickel powder, gold-coated nickel powder, nickel-coated copper powder, nickel-coated silver powder, and metal-coated resin particles.

These particles have excellent conductivity, and are thus suitable as the core particles 26.

When the low-melting-point metal layer 21 is made of tin or an alloy thereof, preferably, nickel is present on the surface of each core particle 26. Specifically, preferably, the surface of the core particle 26 is formed of a nickel layer, which is covered by the low-melting-point metal layer 21.

When the low-melting-point metal layer 21 is made of tin or an alloy thereof, the low-melting-point metal layer 21 and the metal on the surface of the core particle 26 may form an alloy.

However, the presence of nickel on the surface of the core particle 26 can prevent the formation of an alloy between the tin constituting the low-melting-point metal layer 21 and the metal constituting the core particle 26. As a result, the tin constituting the low-melting-point metal layer 21 can efficiently form an alloy with the shielding layer, making it possible to reduce the amount of tin for use in the low-melting-point metal layer 21.

Next, the following describes an exemplary method for producing the ground member of the present invention.

The method for producing the ground member of the present invention includes (1) an external connection member preparing step, (2) a conductive filler particle preparing step, (3) a paste preparing step, and (4) a paste applying step.

Each step is described below with reference to the drawings.

FIGS. 4A to 4D are views schematically showing sequential steps of an exemplary method for producing the ground member of the present invention.

(1) External Connection Member Preparing Step

Figure 4A:
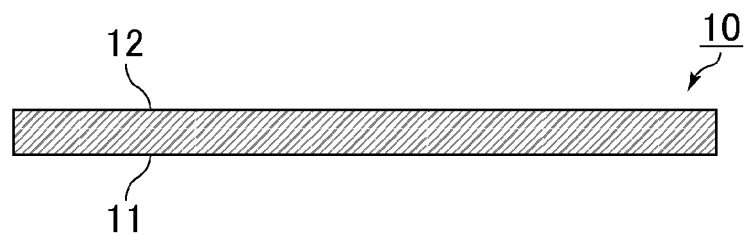
FIGS. 4A to 4D are views schematically showing sequential steps of an exemplary method for producing the ground member of the present invention.

First, as shown in FIG. 4A, the conductive external connection member 10 including the first main surface 11 and the second main surface 12 opposite to the first main surface 11 is prepared.

(2) Conductive Filler Particle Preparing Step

Figure 4B:
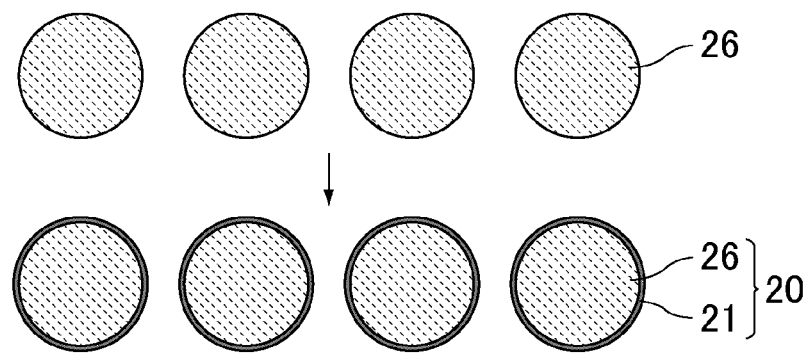

Next, as shown in FIG. 4B, the core particles 26 are provided, and the surface of each core particle 26 is coated with a low-melting-point metal to form the low-melting-point metal layer 21.

The low-melting-point metal layer 21 may be formed by a method such as plating.

In the case where the conductive filler particles are made of copper and the low-melting-point metal layer is made of tin, for example, a method such as electroless plating or electroplating can be used.

The conductive filler particles 20 can be prepared through this step.

(3) Paste Preparing Step

Figure 4C:
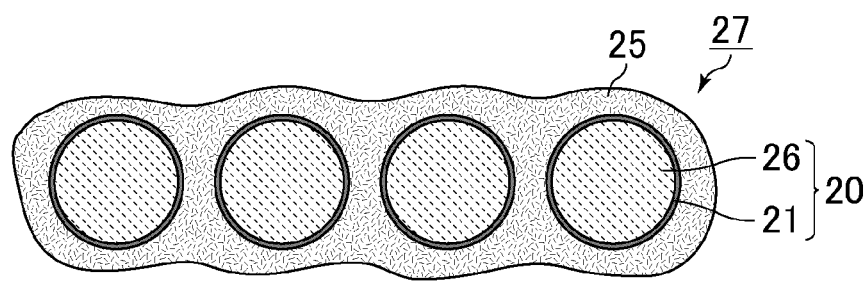

Next, as shown in FIG. 4C, the conductive filler particles 20 are mixed with the adhesive resin 25 to prepare a paste 27.

Here, the weight ratio of the conductive filler particles 20 to the adhesive resin 25 (conductive filler:adhesive resin) is preferably 30:70 to 70:30.

(4) Paste Applying Step

Figure 4D:
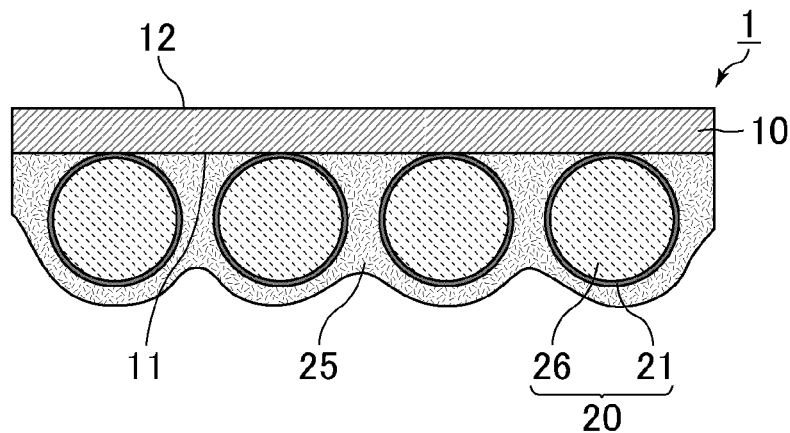

Next, as shown in FIG. 4D, the paste 27 is applied to the first main surface 11 of the external connection member 10.

The ground member 1 can be produced through the above steps.

Next, the following describes the method for producing a shielded printed wiring board using the ground member 1.

It should be noted that this method for producing a shielded printed wiring board is an exemplary method for producing a shielded printed wiring board of the present invention.

The method for producing a shielded printed wiring board of the present invention is a method for producing a shielded printed wiring board, the shielded printed wiring board including: a substrate film sequentially including a base film, a printed circuit including a ground circuit, and an insulating film; a shielding film including an adhesive layer, a shielding layer laminated on the adhesive layer, and an insulating layer laminated on the shielding layer; and the ground member 1 mounted on the insulating layer of the shielding film, the method including: (1) a shielding film placing step; (2) a ground member mounting step; (3) a pressurizing step; and (4) a heating step.

Each step is described below with reference to the drawings.

Figure 5:
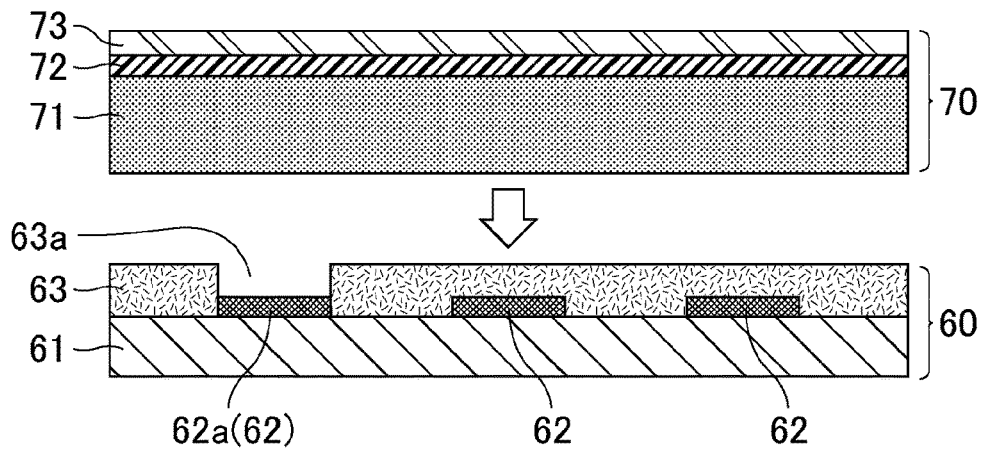
FIG. 5 is a view schematically showing an exemplary shielding film placing step of the method for producing a shielded printed wiring board of the present invention.

FIG. 5 is a view schematically showing an exemplary shielding film placing step of the method for producing a shielded printed wiring board of the present invention.

Figure 6:
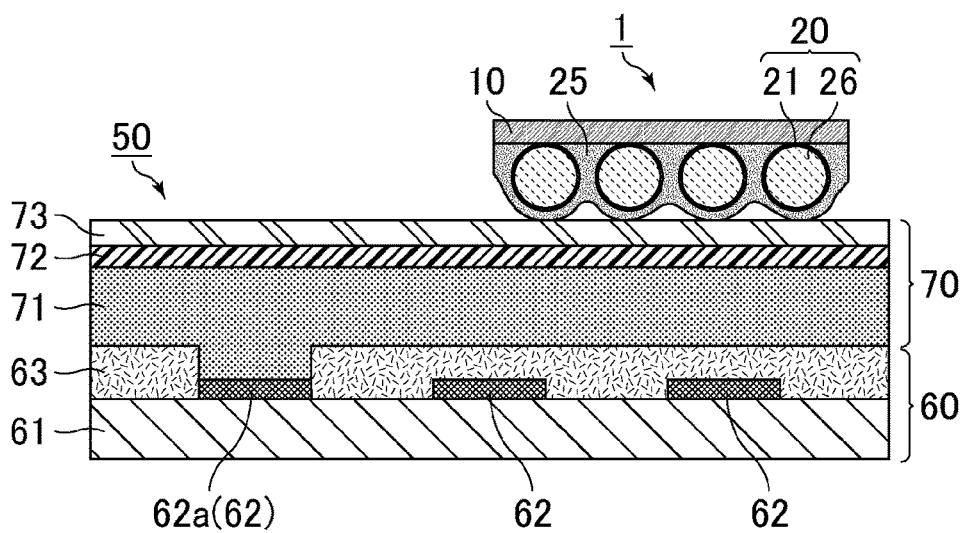
FIG. 6 is a view schematically showing an exemplary ground member mounting step of the method for producing a shielded printed wiring board of the present invention.

FIG. 6 is a view schematically showing an exemplary ground member mounting step of the method for producing a shielded printed wiring board of the present invention.

Figure 7:
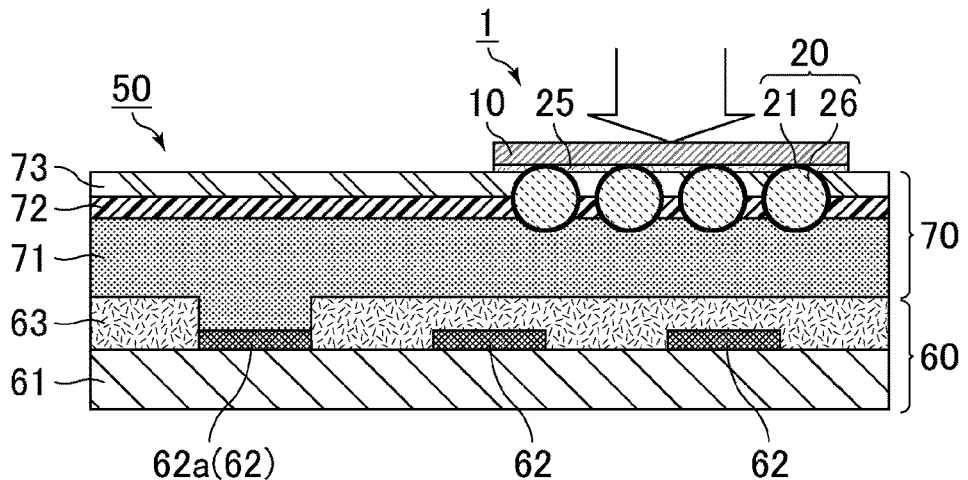
FIG. 7 is a view schematically showing an exemplary pressurizing step of the method for producing a shielded printed wiring board of the present invention.

FIG. 7 is a view schematically showing an exemplary pressurizing step of the method for producing a shielded printed wiring board of the present invention.

Figure 8:
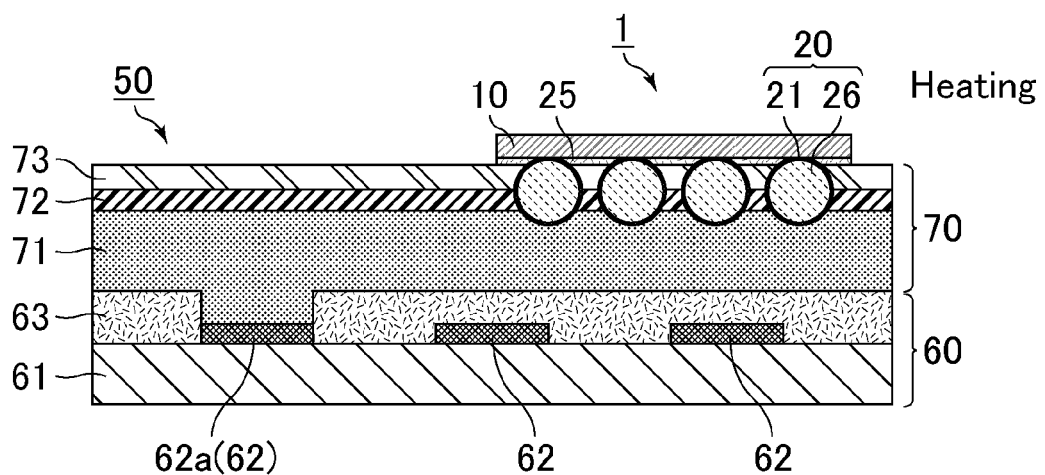
FIG. 8 is a view schematically showing an exemplary heating step of the method for producing a shielded printed wiring board of the present invention.

FIG. 8 is a view schematically showing an exemplary heating step of the method for producing a shielded printed wiring board of the present invention.

(1) Shielding Film Placing Step

In this step, first, the substrate film 60 sequentially including the base film 61, the printed circuit 62 including the ground circuit 62a, and the insulating film 63 is prepared.

The shielding film 70 including the adhesive layer 71 as a conductive adhesive layer, the shielding layer 72 laminated on the adhesive layer 71, and the insulating layer 73 laminated on the shielding layer 72 is also prepared.

As shown in FIG. 5, the shielding film 70 is placed on the substrate film 60 such that the adhesive layer 71 of the shielding film 70 is in contact with the substrate film 60. Thus, the shielded printed wiring board 50 is produced (see FIG. 6).

The base film 61 and the insulating film 63 constituting the substrate film 60 may be formed from any material, but are preferably formed from an engineering plastic. Examples of the engineering plastic include resins such as polyethylene terephthalate, polypropylene, crosslinked polyethylene, polyester, polybenzimidazole, polyimide, polyamide-imide, polyetherimide, and polyphenylene sulfide.

Among these engineering plastic films, a polyphenylene sulfide film is preferred when flame retardancy is required, and a polyimide film is preferred when heat resistance is required. The base film 61 preferably has a thickness of 10 to 40 μm, and the insulating film 63 preferably has a thickness of 10 to 30 μm.

The insulating film 63 includes a hole 63a formed therein for exposing a portion of the printed circuit 62.

The hole 63a may be formed by any conventional method such as laser processing.

The adhesive layer 71 of the shielding film 70 is a conductive adhesive layer including resin and conductive fine particles.

The resin constituting the adhesive layer 71 may be formed from any adhesive resin, but it is preferably an acrylic resin, an epoxy resin, a silicone resin, a thermoplastic elastomer resin, a rubber resin, a polyester resin, a urethane resin, or the like.

The adhesive layer 71 may contain a tackifier such as a fatty acid hydrocarbon resin, a C5/C9 mixture resin, rosin, a rosin derivative, a terpene resin, an aromatic hydrocarbon resin, or a thermally reactive resin. The presence of any of these tackifiers can improve viscosity of the adhesive layer 71.

The adhesive layer 71 may contain any conductive fine particles. Examples of the conductive fine particles include copper powder, silver powder, nickel powder, silver-coated copper powder (Ag-coated Cu powder), gold-coated copper powder, silver-coated nickel powder (Ag-coated Ni powder), and gold-coated nickel powder. These metal powders can be produced by a method such as atomizing or carbonyl method. Besides these metal powders, resin-coated metal particles, or metal-coated resin particles can also be used. The conductive fine particles are preferably particles of Ag-coated Cu powder or Ag-coated Ni powder because conductive fine particles with stable conductivity can be obtained with a low-cost material.

The shape of the conductive fine particles is not limited to a spherical shape. For example, it may be a dendrite shape, flake shape, spike shape, bar shape, fiber shape, or needle shape.

Since the adhesive layer 71 of the shielding film 70 is a conductive adhesive layer, penetration of the conductive filler particles 20 of the ground member 1 through the insulating layer 73 of the shielding film 70 brings the conductive filler particles 20 of the ground member 1 into contact with the shielding layer 72 and the adhesive layer 71 of the shielding film 70 or brings the conductive filler particles 20 of the ground member 1 into contact with the shielding layer 72 of the shielding film 70, which allows the external connection member 10 of the ground member 1 to be electrically connected to the ground circuit 62a of the substrate film 60.

Further, the adhesive layer 71 may be an anisotropic conductive adhesive layer or an isotropic conductive adhesive layer, but an anisotropic conductive adhesive layer is more preferred.

When the adhesive layer 71 is an anisotropic conductive adhesive layer, the conductive fine particles preferably account for 3 to 39% by weight of the total weight of the adhesive layer 71. The conductive fine particles preferably have an average particle size of 2 to 20 µm, but it is preferred to select an optimal average particle size according to the thickness of the anisotropic conductive adhesive layer.

When the adhesive layer 71 is an isotropic conductive adhesive layer, the conductive fine particles preferably account for more than 39% to not more than 95% by weight of the total weight of the adhesive layer 71. The average particle size of the conductive fine particles can be selected as is the case with the anisotropic conductive adhesive layer.

The shielding layer 72 of the shielding film 70 may be formed from any material as long as it exhibits a shielding effect to block noise such as unnecessary radiation from electrical signals and external electromagnetic waves. For example, the shielding layer 72 may be made of metal, or it may be a metal layer such as a metal foil or a vapor deposited film. Alternatively, the shielding layer 72 may be a layer-shaped aggregate of conductive fine particles. When the shielding layer 72 is a metal layer, for example, a material constituting the metal layer preferably includes at least one selected from the group consisting of nickel, copper, silver, gold, palladium, aluminum, chromium, titanium, zinc, and alloys thereof.

When the shielding layer 72 is an aggregate of conductive fine particles, the conductive fine particles described above can be used.

These materials have high conductivity and are suitable for the shielding layer.

Preferably, the shielding layer 72 of the shielding film 70 has a thickness of 0.01 to 10 µm.

A shielding layer having a thickness less than 0.01 µm is less likely to achieve sufficient shielding effect.

A shielding layer having a thickness exceeding 10 µm is not easily bendable.

The insulating layer 73 of the shielding film 70 may be formed from any material, but it is preferably an epoxy resin, a polyester resin, an acrylic resin, a phenolic resin, a urethane resin, or the like.

Preferably, the insulating layer 73 of the shielding film 70 has a thickness of 1 to 10 µm.

(2) Ground Member Mounting Step

In this step, as shown in FIG. 6, the ground member 1 is mounted on the shielding film 70 such that the conductive filler particles 20 of the ground member 1 face the insulating layer 73 of the shielding film 70.

(3) Pressurizing Step

In this step, as shown in FIG. 7, in order to electrically connect the external connection member 10 of the ground member 1 to the ground circuit 62a of the substrate film 60, pressure is applied to the ground member 1 such that the conductive filler particles 20 of the ground member 1 penetrate the insulating layer 73 and the shielding layer 72 of the shielding film 70. Thus, the conductive filler particles 20 of the ground member 1 come into contact with the adhesive layer 71 and the shielding layer 72 of the shielding film 70.

The pressure to be applied is preferably 0.5 MPa to 10 MPa.

In this step, the conductive filler particles 20 of the ground member 1 may penetrate only the insulating layer 73 of the shielding film 70 and come into contact only with the shielding layer 72 of the shielding film 70.

(4) Heating Step

In this step, as shown in FIG. 8, the low-melting-point metal layer 21 of the ground member 1 is heated to be softened in order to connect the low-melting-point metal layer 21 of the ground member 1 to the shielding layer 72 of the shielding film 70.

The temperature to soften the low-melting-point metal layer 21 of the ground member 1 is not particularly limited, but it is preferably 100° C. to 300° C.

This makes it possible to improve adhesion between the core particles 26 of the ground member 1 and the shielding layer 72 of the shielding film 70 and adhesion between the core particles 26 of the ground member 1 and the adhesive layer 71 of the shielding film 70.

In the method for producing a shielded printed wiring board of the present invention, the heating step may be performed at any stage as long as it can soften the low-melting-point metal layer of the ground member to be connected to the shielding layer of the shielding film.

For example, the heating step may be performed simultaneously with the pressurizing step, or may be performed as a single step.

The production efficiency can be improved by simultaneously performing the pressurizing step and the heating step.

The heating step may be performed in the step of mounting components on the shielded printed wiring board after the pressurizing step. For example, if solder is used to mount components, a reflow soldering step will be involved. The low-melting-point metal layer may be softened by heat of reflow soldering in the reflow soldering step. In this case, the heating step and the mounting of components will be performed simultaneously.

In the method for producing a shielded printed wiring board of the present invention, in the shielding film placing step, a shielding film including a shielding film low-melting-point metal layer may be provided between the adhesive layer and the shielding layer and/or between the shielding layer and the insulating layer.

Further, in the heating step, preferably, the shielding film low-melting-point metal layer is softened to be connected to the conductive filler particles of the ground member.

Thus, it is possible to improve adhesion between the conductive filler particles of the ground member and the shielding layer of the shielding film, and adhesion between the conductive filler particles of the ground member and the adhesive layer of the shielding film.

Preferably, the shielding film low-melting-point metal layer is made of a metal having a melting point of 300° C. or lower. If the shielding film low-melting-point metal layer is made of a metal having a melting point of 300° C. or lower, the shielding film low-melting-point metal layer is easily softened when mounting the ground member on the shielded printed wiring board, making it possible to suitably improve adhesion of the conductive filler particles of the ground member to the shielding layer of the shielding film and/or the adhesive layer of the shielding film.

In addition, the metal contained in the shielding film low-melting-point metal layer is not limited, but the metal preferably includes at least one selected from the group consisting of indium, tin, lead, and bismuth.

These metals have melting points and conductivity suitable to form the low-melting-point metal layer.

Preferably, the shielding film low-melting-point metal layer has a thickness of 0.1 to 50 μm.

If the low-melting-point metal layer has a thickness less than 0.1 μm, since the amount of the metal constituting the low-melting-point metal layer is small, it will be difficult to improve adhesion between the conductive filler particles of the ground member and the shielding layer and/or the conductive layer of the shielding film when mounting the ground member on the shielded printed wiring board.

If the shielding film low-melting-point metal layer has a thickness exceeding 50 μm, the shielding layer will easily deform when the shielding film low-melting-point metal layer is softened. As a result, the shielding properties of the shielding film tend to be deteriorated.

Preferably, the shielding film low-melting-point metal layer contains a flux.

The presence of the flux in the shielding film low-melting-point metal layer facilitates adhesion between the metal constituting the shielding film low-melting-point metal layer and the conductive filler particles of the ground member when the metal constituting the shielding film low-melting-point metal layer is softened.

As a result, it is possible to further improve adhesion between the shielding film low-melting-point metal layer and the conductive filler particles of the ground member.

Next, the following describes a case where the ground member 1 is used in a shielded printed wiring board 150 below.

Figure 9A:
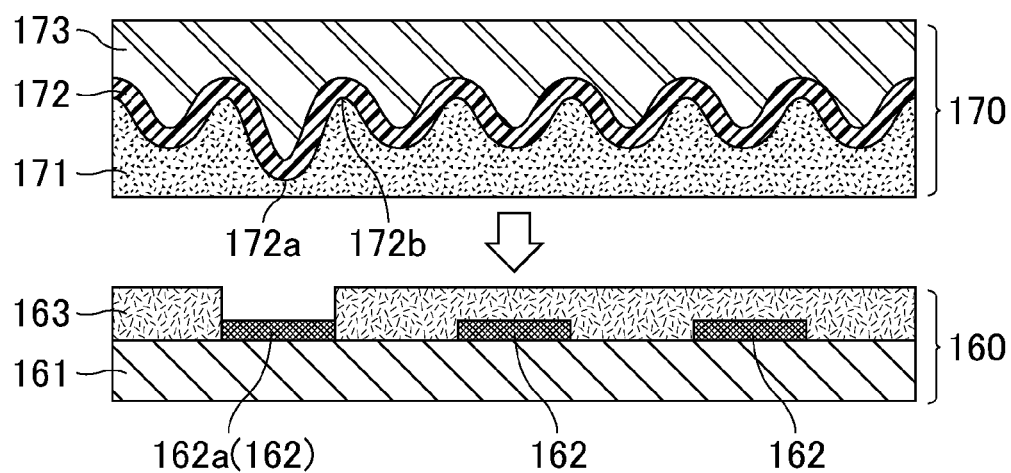
FIGS. 9A and 9B are views schematically showing an exemplary method for producing a shielded printed wiring board in which the ground member of the present invention is to be used.
Figure 9B:
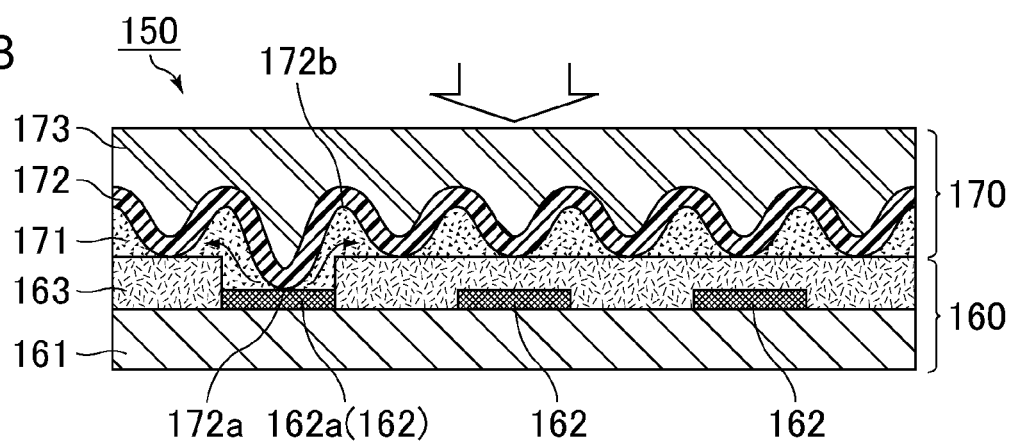

FIGS. 9A and 9B are views schematically showing an exemplary method for producing a shielded printed wiring board in which the ground member of the present invention is to be used.

Figure 10:
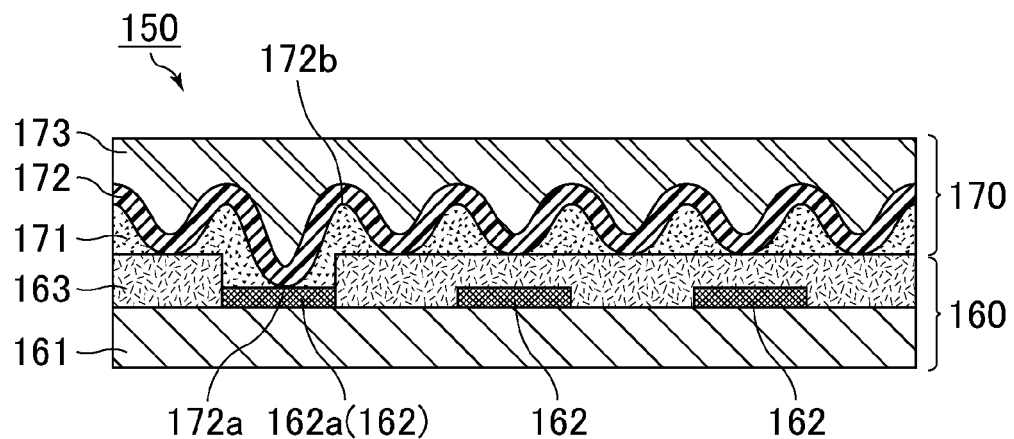
FIG. 10 is a cross-sectional view schematically showing an exemplary shielded printed wiring board in which the ground member of the present invention is to be used.

FIG. 10 is a cross-sectional view schematically showing an exemplary shielded printed wiring board in which the ground member of the present invention is to be used.

As shown in FIG. 9A, first, a shielding film 170 is placed on a substrate film 160 when producing the shielded printed wiring board 150.

The substrate film 160 is a film sequentially including a base film 161, a printed circuit 162 including a ground circuit 162a, and an insulating film 163.

The shielding film 170 is a film including an adhesive layer 171, a shielding layer 172 laminated on the adhesive layer 171, and an insulating layer 173 laminated on the shielding layer 172. The shielding layer 172 has a corrugated shape with projections 172a and depressions 172b.

The adhesive layer 171 of the shielding film 170 may or may not have conductivity.

Next, as shown in FIG. 9B, the adhesive layer 171 is pressured onto the substrate film 160, whereby the shielded printed wiring board 150 can be produced.

At the time of pressurizing, the projections 172a of the shielding layer 172 of the shielding film 170 push aside the adhesive layer 171 and are connected to the ground circuit 162a of the substrate film 160.

In this manner, the shielded printed wiring board 150 as shown in FIG. 10 can be produced.

Specifically, as shown in FIG. 10, the shielded printed wiring board 150 includes the substrate film 160 and the shielding film 170.

In the shielded printed wiring board 150, the substrate film 160 is a film sequentially including the base film 161, the printed circuit 162 including the ground circuit 162a, and the insulating film 163.

In addition, the shielding film 170 is a film including an adhesive layer 171, a shielding layer 172 laminated on the adhesive layer 171, and an insulating layer 173 laminated on the shielding layer 172. The shielding layer 172 has a corrugated shape with projections 172a and depressions 172b.

In the shielded printed wiring board 150, the shielding film 170 covers the substrate film 160 such that the adhesive layer 171 of the shielding film 170 is in contact with the substrate film 160.

In addition, a portion of the projection 172a of the shielding layer 172 is exposed from the adhesive layer 171 and is in contact with the ground circuit 162a of the substrate film 160.

Next, the following describes a case where the ground member 1 is used in the shielded printed wiring board 150 with reference to the drawings.

Figure 11:
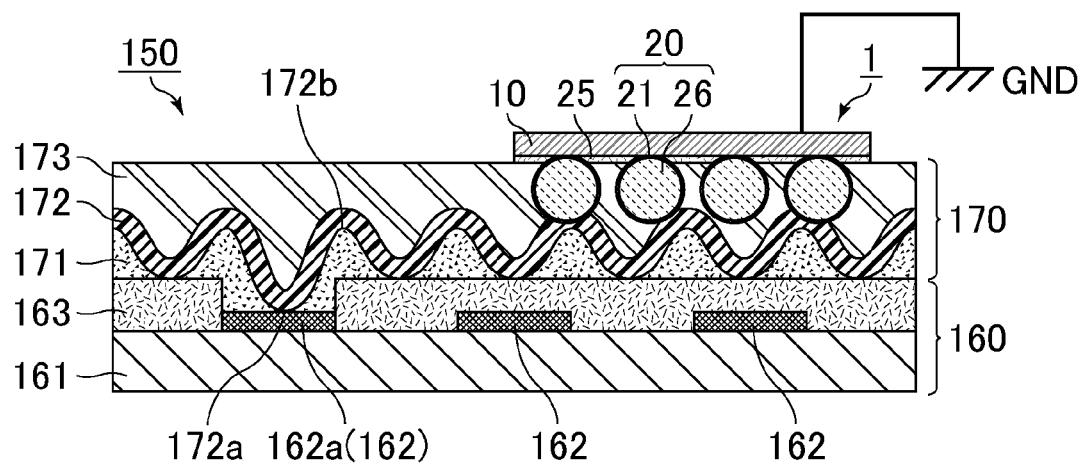
FIG. 11 is a schematic view schematically showing an example where the ground member of the present invention is used in the shielded printed wiring board.

FIG. 11 is a schematic view schematically showing an example where the ground member of the present invention is used in the shielded printed wiring board.

As shown in FIG. 11, the ground member 1 is mounted by being pressured onto the shielded printed wiring board 150 such that the conductive filler particles 20 of the ground member 1 penetrate the insulating layer 173 of the shielding film 170.

This allows the conductive filler particles 20 of the ground member 1 to be connected to the shielding layer 172 of the shielding film 170.

As described above, since the shielding layer 172 of the shielding film 170 is in contact with the ground circuit 162a of the substrate film 160, the external connection member 10 of the ground member 1 is to be electrically connected to the ground circuit 162a of the substrate film 160.

The external connection member 10 of the ground member 1 is to be connected to an external ground GND.

Since the ground member 1 is mounted on the shielded printed wiring board 150 as described above, the ground member 1 can be mounted on any position without forming a hole or the like in advance in the insulating layer 173 of the shielding film 170 of the shielded printed wiring board 150.

In the ground member 1, each conductive filler particle 20 includes the core particle 26 and the low-melting-point metal layer 21 formed on a surface of the core particle 26.

Heating is performed when mounting the ground member 1 on the shielded printed wiring board 150 and in the component mounting step after the ground member is mounted. The heating softens the low-melting-point metal layer 21, thus improving adhesion between the core particles 26 of the ground member 1 and the shielding layer 172 of the shielding film 170.

Thus, even when the shielded printed wiring board 150 including the ground member 1 is repeatedly heated and cooled to mount components thereon, misalignment is less likely to occur between the core particles 26 of the ground member 1 and the shielding layer 172 of the shielding film 170. As a result, an increase in electrical resistance between the ground circuit 162a of the substrate film 160 and an external ground GND can be suppressed.

In the shielded printed wiring board 150, a preferred substrate film 160 is the same as the substrate film 60 described for the shielded printed wiring board 50.

In the shielded printed wiring board 150, preferred materials of the shielding layer 172 and the insulating layer 173 constituting the shielding film 170 are the same as those of the shielding layer 72 and the insulating layer 73 of the shielding film 70 described for the shielded printed wiring board 50.

In the shielded printed wiring board 150, the adhesive layer 171 constituting the shielding film 170 may be formed from any material, but it is preferably an acrylic resin, an epoxy resin, a silicone resin, a thermoplastic elastomer resin, a rubber resin, a polyester resins, a urethane resin, or the like.

The adhesive layer 171 may contain a tackifier such as a fatty acid hydrocarbon resin, a C5/C9 mixture resin, rosin, a rosin derivative, a terpene resin, an aromatic hydrocarbon resin, or a thermally reactive resin. The presence of any of these tackifiers can improve viscosity of the adhesive layer 171.

In the shielded printed wiring board 150, the shielding film 170 may include a low-melting-point metal layer formed between the shielding layer 172 and the insulating layer 173, and the shielding film low-melting-point metal layer may be connected to the conductive filler particles 20 of the ground member 1.

Such a structure can improve adhesion between the conductive filler particles 20 of the ground member 1 and the shielding layer 172 of the shielding film 170.

Next, the following describes a case where the ground member 1 is used in a shielded printed wiring board 250 below.

Figure 12:
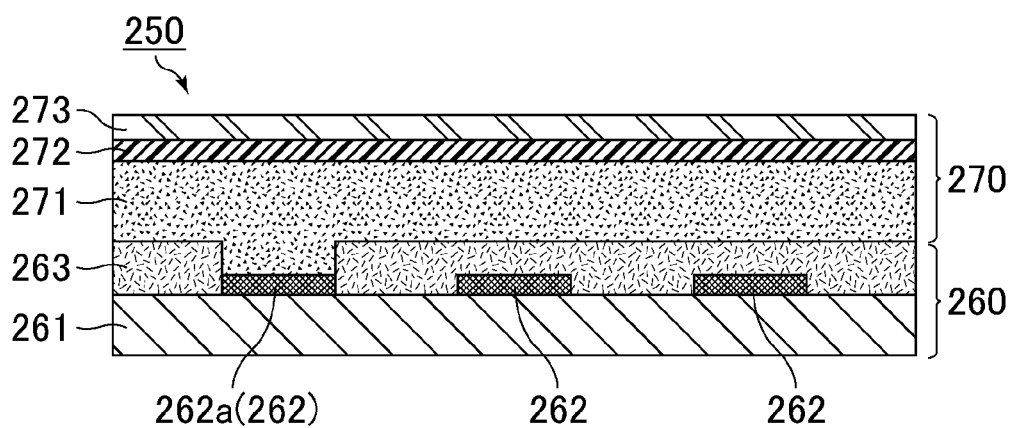
FIG. 12 is a cross-sectional view schematically showing an exemplary shielded printed wiring board in which the ground member of the present invention is to be used.

FIG. 12 is a cross-sectional view schematically showing an exemplary shielded printed wiring board in which the ground member of the present invention is to be used.

As shown in FIG. 12, the shielded printed wiring board 250 includes a substrate film 260 and a shielding film 270.

In the shielded printed wiring board 250, the substrate film 260 is a film sequentially including a base film 261, a printed circuit 262 including a ground circuit 262a, and an insulating film 263.

The shielding film 270 is a film including an adhesive layer 271, a shielding layer 272 laminated on the adhesive layer 271, and an insulating layer 273 laminated on the shielding layer 272.

In the shielded printed wiring board 250, the shielding film 270 covers the substrate film 260 such that the adhesive layer 271 of the shielding film 270 is in contact with the substrate film 260.

The adhesive layer 271 of the shielding film 270 does not have conductivity, and the printed circuit 262 is not electrically connected to the shielding layer 272.

Next, the following describes a case where the ground member 1 is used in the shielded printed wiring board 250 with reference to the drawings.

Figure 13:
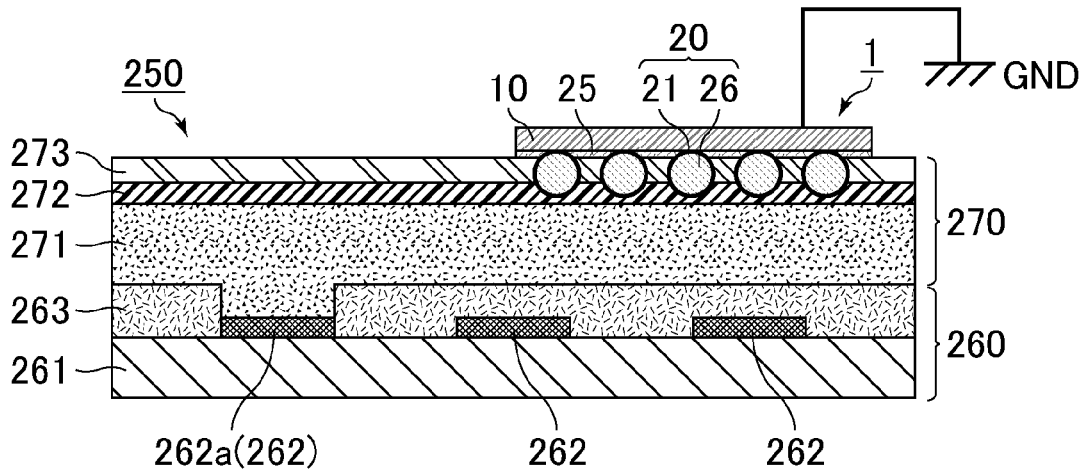
FIG. 13 is a schematic view schematically showing an example where the ground member of the present invention is used in the shielded printed wiring board.

FIG. 13 is a schematic view schematically showing an example where the ground member of the present invention is used in the shielded printed wiring board.

As shown in FIG. 13, the ground member 1 is mounted by being pressured onto the shielded printed wiring board 250 such that the conductive filler particles 20 of the ground member 1 penetrate the insulating layer 273 of the shielding film 270 and are also connected to the shielding layer 272.

This allows the conductive filler particles 20 of the ground member 1 to be connected to the shielding layer 272 of the shielding film 270. Thus, it is possible to electrically connect the external connection member 10 of the ground member 1 to the shielding layer 272 of the shielding film 270.

The external connection member 10 of the ground member 1 is to be connected to an external ground GND.

In the shielded printed wiring board 250 on which the ground member 1 is mounted as described above, the shielding layer 272 of the shielding film 270 is electrically connected to an external ground GND, so that the shielding layer 272 suitably functions as an electromagnetic wave shield to block electromagnetic waves.

Since the ground member 1 is mounted on the shielded printed wiring board 250 as described above, the ground member 1 can be mounted on any position without forming a hole or the like in advance in the insulating layer 273 of the shielding film 270 of the shielded printed wiring board 250.

In the ground member 1, each conductive filler particle 20 includes the core particle 26 and the low-melting-point metal layer 21 formed on a surface of the core particle 26.

Heating is performed when mounting the ground member 1 on the shielded printed wiring board 250 and in the component mounting step after the ground member is mounted. The heating softens the low-melting-point metal layer 21, thus improving adhesion between the core particles 26 of the ground member 1 and the shielding layer 272 of the shielding film 270.

Thus, even when the shielded printed wiring board 250 including the ground member 1 is repeatedly heated and cooled to mount components thereon, misalignment is less likely to occur between the core particles of 26 the ground member 1 and the shielding layer 272 of the shielding film 270.

In addition, since the adhesive layer 271 does not contain conductive fine particles, it is possible to reduce raw material costs of the adhesive layer 271 and to make the adhesive layer 271 thinner.

In the shielded printed wiring board 250, a preferred substrate film 260 is the same as the substrate film 60 described for the shielded printed wiring board 50.

In the shielded printed wiring board 250, preferred materials of the shielding layer 272 and the insulating layer 273 constituting the shielding film 270 are the same as those of the shielding layer 72 and the insulating layer 73 of the shielding film 70 described for the shielded printed wiring board 50.

In the shielded printed wiring board 250, the adhesive layer 271 constituting the shielding film 270 may be formed any material, but it is preferably an acrylic resin, an epoxy resin, a silicone resin, a thermoplastic elastomer resin, a rubber resin, a polyester resin, a urethane resin, or the like.

The adhesive layer 271 may contain a tackifier such as a fatty acid hydrocarbon resin, a C5/C9 mixture resin, rosin, a rosin derivative, a terpene resin, an aromatic hydrocarbon resin, or a thermally reactive resin. The presence of any of these tackifiers can improve viscosity of the adhesive layer 271.

In the shielded printed wiring board 250, the shielding film 270 may include a low-melting-point metal layer formed between the shielding layer 272 and the insulating layer 273, and the shielding film low-melting-point metal layer may be connected to the conductive filler particles 20 of the ground member 1.

Such a structure can improve adhesion between the conductive filler particles 20 of the ground member 1 and the shielding layer 272 of the shielding film 270.

Next, the following describes a case where the ground member 1 is used in a shielded printed wiring board 350 below.

Figure 14:
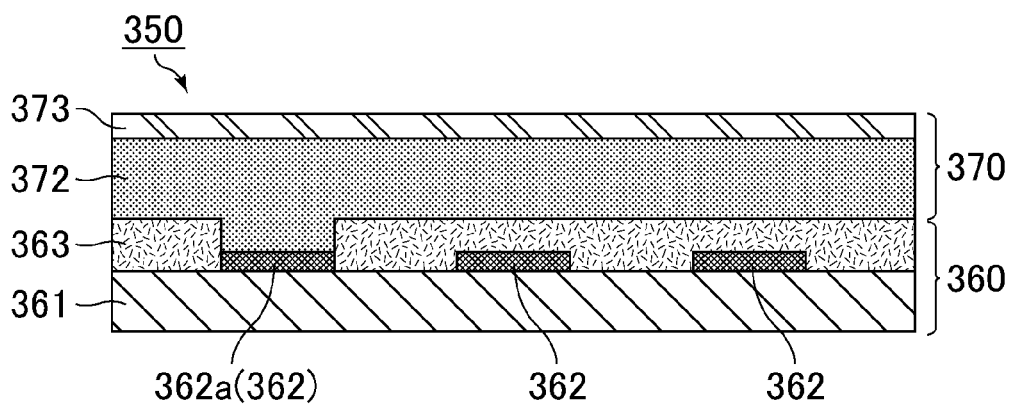
FIG. 14 is a cross-sectional view schematically showing an exemplary shielded printed wiring board in which the ground member of the present invention is to be used.

FIG. 14 is a cross-sectional view schematically showing an exemplary shielded printed wiring board in which the ground member of the present invention is to be used.

As shown in FIG. 14, the shielded printed wiring board 350 includes a substrate film 360 and a shielding film 370.

In the shielded printed wiring board 350, the substrate film 360 is a film sequentially including a base film 361, a printed circuit 362 including a ground circuit 362a, and an insulating film 363.

The shielding film 370 is a film including a shielding layer 372 and an insulating layer 373 laminated on the shielding layer 372.

In the shielded printed wiring board 350, the shielding film 370 covers the substrate film 360 such that the shielding layer 372 of the shielding film 370 is in contact with the substrate film 360.

The shielding layer 372 of the shielding film 370 is a conductive adhesive layer.

Next, the following describes a case where the ground member 1 is included in the shielded printed wiring board 350 with reference to the drawings.

Figure 15:
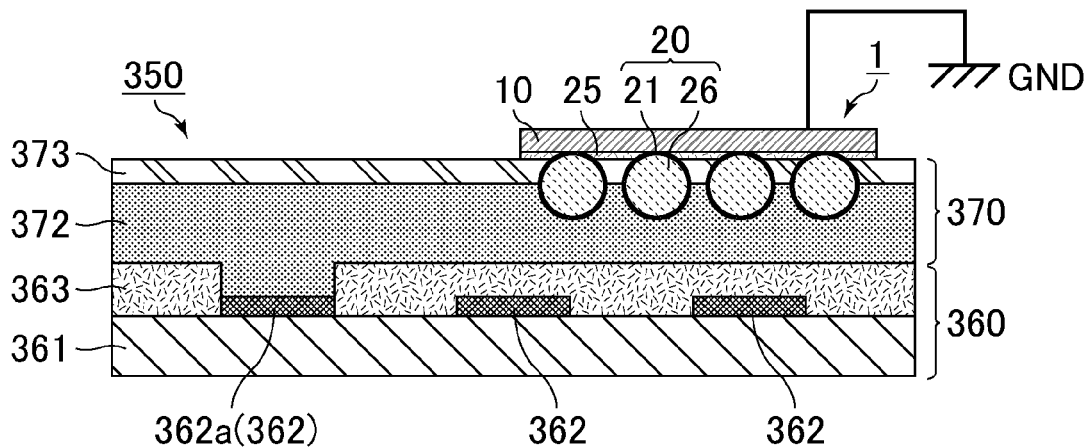
FIG. 15 is a schematic view schematically showing an example where the ground member of the present invention is used in the shielded printed wiring board.

FIG. 15 is a schematic view schematically showing an example where the ground member of the present invention is used in the shielded printed wiring board.

As shown in FIG. 15, the ground member 1 is mounted by being pressured onto the shielded printed wiring board 350 such that the conductive filler particles 20 of the ground member 1 penetrate the insulating layer 373 of the shielding film 370.

This allows the conductive filler particles 20 of the ground member 1 to be connected to the shielding layer 372 of the shielding film 370.

As described above, since the shielding layer 372 of the shielding film 370 is in contact with the ground circuit 362a of the substrate film 360, the external connection member 10 of the ground member 1 is to be electrically connected to the ground circuit 362a of the substrate film 360.

The external connection member 10 of the ground member 1 is to be connected to an external ground GND.

Since the ground member 1 is mounted on the shielded printed wiring board 350 as described above, the ground member 1 can be mounted on any position without forming a hole or the like in advance in the insulating layer 373 of the shielding film 370 of the shielded printed wiring board 350.

In the ground member 1, each conductive filler particle 20 includes the core particle 26 and the low-melting-point metal layer 21 formed on a surface of the core particle 26.

Heating is performed when mounting the ground member 1 on the shielded printed wiring board 350 and in the component mounting step after the ground member is mounted. The heating softens the low-melting-point metal layer 21, thus improving adhesion between the core particles 26 of the ground member 1 and the shielding layer 372 of the shielding film 370.

Thus, even when the shielded printed wiring board 350 including the ground member 1 is repeatedly heated and cooled to mount components thereon, misalignment is less likely to occur between the conductive filler particles 20 of the ground member 1 and the shielding layer 372 of the shielding film 370. As a result, an increase in electrical resistance between the ground circuit 362a of the substrate film 360 and an external ground GND can be suppressed.

In the shielded printed wiring board 350, the shielding layer 372 of the shielding film 370, which is a conductive adhesive layer, has functions not only to allow the shielding film 370 to adhere to the substrate film 360 and but also to block electromagnetic waves.

Thus, the shielding film 370 can easily adhere to the substrate film 360 without using an adhesive or the like to allow the shielding film 370 to adhere to the substrate film 360.

In the shielded printed wiring board 350, a preferred substrate film 360 is the same as the substrate film 60 described for the shielded printed wiring board 50.

In the shielded printed wiring board 350, preferred materials of the insulating layer 373 constituting the shielding film 370 are the same as those of the insulating layer 73 of the shielding film 70 described for the shielded printed wiring board 50.

In the shielded printed wiring board 350, the shielding layer 372 of the shielding film 370 is a conductive adhesive layer including resin and conductive fine particles.

The shielding layer 372 may be formed from any resin, but it is preferably an acrylic resin, an epoxy resin, a silicone resin, a thermoplastic elastomer resin, a rubber resin, polyester resin, a urethane resin, or the like.

The shielding layer 372 may contain a tackifier such as a fatty acid hydrocarbon resin, a C5/C9 mixture resin, rosin, a rosin derivative, a terpene resin, an aromatic hydrocarbon resin, or a thermally reactive resin. The presence of any of these tackifiers can improve viscosity of the shielding layer 372.

The adhesive layer 372 may be formed from any conductive fine particles. Examples include copper powder, silver powder, nickel powder, silver-coated copper powder (Ag-coated Cu powder), gold-coated copper powder, silver-coated nickel powder (Ag-coated Ni powder), and gold-coated nickel powder. These metal powders can be produced by a method such as atomizing or carbonyl method. Besides these metal powders, resin-coated metal particles, or metal-coated resin particles can also be used. The conductive fine particles are preferably particles of Ag-coated Cu powder or Ag-coated Ni powder because conductive fine particles with stable conductivity are obtained with a low-cost material.

The shape of the conductive fine particles is not limited to a spherical shape. For example, it may be a dendrite shape, flake shape, spike shape, bar shape, fiber shape, or needle shape. The conductive fine particles each may include a low-melting-point metal layer on its surface. This low-melting-point metal layer may be same as the low-melting-point metal layer described above.

Further, the shielding layer 372 of the shielding film 370 is preferably an isotropic conductive adhesive layer.

In this case, the conductive fine particles preferably account for more than 39% to not more than 95% by weight of the total weight of the shielding layer. The conductive fine particles preferably have an average particle size of 2 to 20 μm.

In the shielded printed wiring board 350, the shielding film 370 may include a low-melting-point metal layer formed between the shielding layer 372 and the insulating layer 373, and the shielding film low-melting-point metal layer may be connected to the conductive filler particles 20 of the ground member 1.

Such a structure can improve adhesion between the conductive filler particles 20 of the ground member 1 and the shielding layer 372 of the shielding film 370.

The shielded printed wiring board 150 including the ground member 1, the shielded printed wiring board 250 including the ground member 1, and the shielded printed wiring board 350 including the ground member 1, which have been described above, are examples of the shielded printed wiring board of the present invention.

The shielded printed wiring board 150 including the ground member 1, the shielded printed wiring board 250 including the ground member 1, or the shielded printed wiring board 350 including the ground member 1 can be produced by preparing the shielding film 170, the shielding film 270, or the shielding film 370, respectively, instead of the shielding film 70 in "(1) Shielding film placing step" of the method for producing the shielded printed wiring board 50 including the ground member 1.

Second Embodiment

Next, the following describes a ground member according to another embodiment, i.e., a second embodiment, of the ground member of the present invention.

Figure 16:
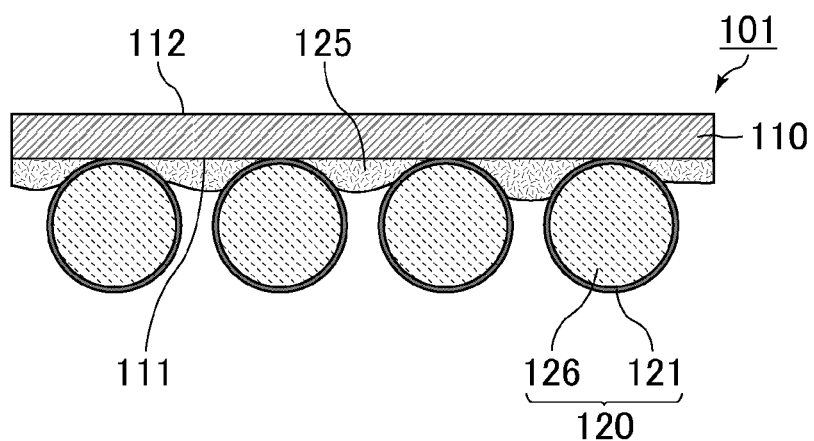
FIG. 16 is a cross-sectional view schematically showing an exemplary ground member of the present invention.

FIG. 16 is a cross-sectional view schematically showing an exemplary ground member of the present invention.

As shown in FIG. 16, a ground member 101 includes a conductive external connection member 110 having a first main surface 111 and a second main surface 112 opposite to the first main surface 111.

The ground member 101 also includes conductive filler particles 120 fixed to the first main surface 111 by an adhesive resin 125.

Each conductive filler particle 120 includes a core particle 126 and a low-melting-point metal layer 121 formed on at least a portion of a surface of the core particle 126.

Further, in the ground member 101, a portion of the conductive filler particle 120 is exposed from the adhesive resin 125.

When a portion of the conductive filler particle 120 is exposed from the adhesive resin 125, electricity can flow through the exposed portion. Thus, when the ground member 1 is used in a shielded printed wiring board, the conductive filler particles 120 of the ground member 101 can be easily electrically connected to the shielding layer of the shielding film.

Preferred materials of the external connection member 110, preferred materials of the adhesive resin 125, preferred materials of the core particles 26, preferred metals to form the low-melting-point metal layer 121 of the ground member 101 are the same as the preferred materials of the external connection member 10, preferred materials of the adhesive resin 25, preferred materials of the core particles 26, the preferred metals to form the low-melting-point metal layer 21 of the ground member 1 described above.

Other Embodiments

The above has described external ground members in which each conductive filler particle includes a core particle and a low-melting-point metal layer made of a low-melting-point metal formed on at least a portion of a surface of the core particle.

However, in the ground member of the present invention, any filler particle may be used as long as it includes a low-melting-point metal. For example, instead of the above-described conductive filler particles each including a core particle and a low-melting-point metal layer, conductive filler particles each consisting of a low-melting-point metal or conductive filler particles each consisting of a flux-containing low-melting-point metal may be used.

In the case of conductive filler particles each consisting of a low-melting-point metal or conductive filler particles each consisting of a flux-containing low-melting-point metal, the metal preferably has a melting point of 300° C. or lower.

In addition, the low-melting-point metal preferably includes at least one selected from the group consisting of indium, tin, lead, and bismuth.

In addition, in the case of conductive filler particles each consisting of a low-melting-point metal or conductive filler particles each consisting of a flux-containing low-melting-point metal, the conductive filler particles preferably have an average particle size of 1 to 200 μm.

When a flux is contained, any known flux can be used. Examples include polyvalent carboxylic acid, lactic acid, citric acid, oleic acid, stearic acid, glutamic acid, benzoic acid, glycerol, and rosin.

Preferred materials and the like of the external connection member and the adhesive resin of the ground member are the same as the preferred materials and the like of the external connection member and the adhesive resin described for the ground member according to the first embodiment of the present invention.

EXAMPLES

Examples that more specifically describe the present invention are provided below, but the present invention is not limited to these examples.

Example 1-1

(1) External Connection Member Preparing Step

Copper foil having a thickness of 35 μm was provided as an external connection member.

(2) Conductive Filler Particle Preparing Step

Nickel particles having a particle size of 10 to 15 μm were provided as core particles.

Next, tin was plated on each nickel particle surface by electrotinplating to form a low-melting-point metal layer. The low-melting-point metal layer content (i.e., the amount of tin) in each conductive filler particle was 8.8 wt %.

Thus, conductive filler particles were prepared.

(3) Paste Preparing Step

The conductive filler particles prepared were mixed with a bisphenol A epoxy resin to prepare a paste.

The weight ratio of the conductive filler particles to the bisphenol A epoxy resin (conductive filler particles:bisphenol A epoxy resin) was 100:47 (in terms of parts by weight).

(4) Paste Applying Step

Next, the paste was applied to the copper foil to a thickness of 30 μm. Thus, a ground member according to Example 1-1 was produced.

(Example 1-2) to (Example 1-7) and (Comparative Example 1-1) to (Comparative Example 1-3)

Ground members according to Examples 1-2 to 1-7 and Comparative Examples 1-1 to 1-3 were produced as in Example 1-1, except that the type of core particles, the type of metal to coat the core particles, and the metal content were changed as shown in Table 1.

TABLE 1

| Ground member | Shielded printed wiring board | Core particle type | Metal to coat core particles | Metal conent (wt %) to coat core particles | Initial electrical resistance (Ω) |
|---|---|---|---|---|---|
| Example 1-1 | Example 2-1 | Nickel | Tin | 8.8 | 0.138 |
| Example 1-2 | Example 2-2 | Nickel | Tin | 11.6 | 0.014 |
| Example 1-3 | Example 2-3 | Copper | Tin | 28.5 | 0.023 |
| Example 1-4 | Example 2-4 | Copper | Tin | 39.3 | 0.023 |
| Example 1-5 | Example 2-5 | Copper | Tin | 54.6 | 0.017 |
| Example 1-6 | Example 2-6 | Copper | Tin | 72.6 | 0.016 |
| Example 1-7 | Example 2-7 | Copper | Tin | 76.1 | 0.043 |
| Comparative Example 1-1 | Comparative Example 2-1 | Nickel | Copper | 4.8 | 0.046 |
| Comparative Example 1-2 | Comparative Example 2-2 | Nickel | Copper | 9.3 | 0.124 |
| Comparative Example 1-3 | Comparative Example 2-3 | Nickel | Copper | 15.3 | 0.199 |

Example 2-1

A shielded printed wiring board according to Example 2-1 was produced using the ground member of Example 1-1 by the following method.
(1) Shielding Film Placing Step
First, a substrate film sequentially including a base film, a printed circuit including a ground circuit, and a coverlay was prepared.
In the substrate film, the base film was formed from a polyimide resin; the ground circuit and the printed circuit were formed from copper; and the coverlay was formed from a polyimide resin.
The coverlay included a hole for exposing a portion of the printed circuit.
In addition, a shielding film sequentially including a shielding layer, and an insulating layer was prepared.
The anisotropic conductive adhesive layer was formed from a bisphenol A epoxy resin and copper microparticles having an average particle size of 10 µm. The weight ratio of the bisphenol A epoxy resin to the copper microparticles was 100:47 (in terms of parts by weight). The anisotropic conductive adhesive layer had a thickness of 9 µm.
The shielding layer was made of copper, and had a thickness of 2 µm.
The insulating layer was formed from an epoxy resin, and had a thickness of 6 µm.
Next, the shielding film was placed on the substrate film such that the anisotropic conductive adhesive layer would be in contact with the substrate film.
(2) Ground Member Mounting Step
Next, the ground member according to Example 1-1 was mounted on the shielding film such that the conductive filler particles of the ground member according to Example 1-1 would face the insulating layer of the shielding film.
(3) Pressurizing Step
Next, in order to electrically connect the external connection member of the ground member according to Example 1-1 to the ground circuit of the substrate film, pressure was applied to the ground member such that the conductive filler particles of the ground member would penetrate the insulating layer of the shielding film.
The pressurizing conditions were as follows: temperature: 170° C., pressure: 3 MPa, time: 30 min.

(4) Heating Step
Next, the ground member, the shielding film, and the wiring board were baked at 150° C. for one hour, followed by a heating step (reflow soldering step) involving heating five times at 260° C. for five seconds per time.
In this heating step, the low-melting-point metal layer formed on the surface of each conductive filler particle of the ground member according to Example 1-1 was softened to connect the conductive filler particles of the ground member to the anisotropic conductive adhesive layer and the shielding layer of the shielding film by the low-melting-point metal layer.
The shielded printed wiring board according to Example 2-1 was produced through the above steps.

Example 2-2 to Example 2-7 and Comparative Example 2-1 to Comparative Example 2-3

Shielded printed wiring boards according to Example 2-2 to Example 2-7 were produced as in Example 2-1, except that the ground members according to Example 1-2 to Example 1-7 were used as the ground members.
(Measurement of Initial Electrical Resistance)
Ten of each of the shielded printed wiring boards according to Examples 2-1 to 2-7 and Comparative Examples 2-1 to 2-3 were prepared, and the electrical resistance between the ground circuit of the substrate film and the external ground was measured. Table 1 shows average values of electrical resistance in the examples.
As shown in Table 1, the shielded printed wiring boards according to Examples 2-1 to 2-7 exhibited sufficiently low initial electrical resistance between the ground circuit of the substrate film and the external ground.
(Test to Measure Changes in Electrical Resistance by Repeated Heating and Cooling)
Ten of each of the shielded printed wiring boards according to Examples 2-1 and 2-2 and Comparative Examples 2-1 to 2-3 were prepared.
Then, heating treatment that involves heating at 120° C. for 20 minutes and cooling treatment that involves cooling to a temperature of −55° C. were repeated 200 times in total. Subsequently, the electrical resistance between the ground circuit of the substrate film and the external ground was measured. Table 2 shows the results.

TABLE 2

| Ground member | Shielded printed wiring board | Core particle type | Metal to coat core particles | Metal conent (wt %) to coat core particles | Electrical resistance (Ω) after repeated heating and cooling |
|---|---|---|---|---|---|
| Example 1-1 | Example 2-1 | Nickel | Tin | 8.8 | 0.150 |
| Example 1-2 | Example 2-2 | Nickel | Tin | 11.6 | 0.014 |
| Comparative Example 1-1 | Comparative Example 2-1 | Nickel | Copper | 4.8 | 0.598 |
| Comparative Example 1-2 | Comparative Example 2-2 | Nickel | Copper | 9.3 | 0.549 |
| Comparative Example 1-3 | Comparative Example 2-3 | Nickel | Copper | 15.3 | 0.519 |

As shown in Table 2, repeated heating and cooling increased the electrical resistance in the shielded printed wiring boards according to Comparative Examples 2-1 to 2-3 each including the ground member in which each conductive filler particle had a high-melting-point metal layer (copper layer) formed thereon. Presumably, such an increase in electrical resistance was due to misalignment between the external connection member and the core particles of the ground member and between the core particles of the ground member and the shielding layer of the shielding film by repeated heating and cooling.

In contrast, the repeated heating and cooling caused only minor changes in electrical resistance in the shielded printed wiring boards according to Examples 2-1 and 2-2 each including the ground member in which each conductive filler particle had a low-melting-point metal layer (tin layer) formed thereon. The changes were minor presumably because the repeated heating and cooling hardly caused misalignment between the external connection member and the core particles of the ground member and between the core particles of the ground member and the shielding layer of the shielding film.

REFERENCE SIGNS LIST 1, 101 ground member
10, 110 external connection member
11, 111 first main surface
12, 112 second main surface
20, 120 conductive filler particle
21, 121 low-melting-point metal layer
25, 125 adhesive resin
26, 126 core particle
27 paste
50, 150, 250, 350 shielded printed wiring board
60, 160, 260, 360 substrate film
61, 161, 261, 361 base film
62, 162, 262, 362 printed circuit
62a, 162a, 262a, 362a ground circuit
63, 163, 263, 363 insulating film
63a hole
70, 170, 270, 370 shielding film
71, 171, 271 adhesive layer
72, 172, 272, 372 shielding layer
73, 173, 273, 373 insulating layer
172a projection
172b depression
GND external ground

The invention claimed is:

1. A ground member comprising:
    a conductive external connection member having a first main surface and a second main surface opposite to the first main surface;
    conductive filler particles disposed adjacent to the first main surface; and
    an adhesive resin for fixing the conductive filler particles to the first main surface,
    wherein the conductive filler particles comprise a low-melting-point metal,
    wherein the conductive filler particles each comprise a core particle and a low-melting-point metal layer made of the low-melting-point metal that is formed on at least a portion of a surface of the core particle, and
    wherein the core particle is at least one selected from the group consisting of nickel powder, silver-coated nickel powder, and gold-coated nickel powder.

2. The ground member according to claim 1, wherein the core particles have an average particle size of 1 to 200 μm.

3. The ground member according to claim 1, wherein the low-melting-point metal layer has a thickness of 0.1 to 50 μm.

4. The ground member according to claim 1, wherein the low-melting-point metal layer comprises a flux.

5. The ground member according to claim 1, wherein the conductive filler particles are surrounded by the adhesive resin.

6. The ground member according to claim 1, wherein at least a portion of the conductive filler particles is exposed from the adhesive resin.

7. The ground member according to claim 1, wherein the low-melting-point metal has a melting point of 300° C. or lower.

8. The ground member according to claim 1, wherein the external connection member comprises at least one selected from the group consisting of copper, aluminum, silver, gold, nickel, chromium, titanium, zinc, and stainless steel.

9. The ground member according to claim 1, wherein the second main surface comprises a corrosion resistant layer formed thereon.

10. The ground member according to claim 9, wherein the corrosion resistant layer comprises at least one selected from the group consisting of nickel, gold, silver, platinum, palladium, rhodium, iridium, ruthenium, osmium, and alloys thereof.

11. A method for producing a shielded printed wiring board including a substrate film sequentially including a base film, a printed circuit including a ground circuit, and an insulating film, a shielding film including a shielding layer and an insulating layer laminated on the shielding layer, and the ground member according to claim 1 mounted on the insulating layer of the shielding film, the method comprising:
    a shielding film placing step of placing the shielding film on the substrate film such that the shielding layer of the shielding film is closer to the substrate film than the insulating layer of the shielding film is;

a ground member mounting step of mounting the ground member on the shielding film such that the conductive filler particles of the ground member face the insulating layer of the shielding film;

a pressurizing step of applying pressure to the ground member such that the conductive filler particles of the ground member penetrate the insulating layer of the shielding film; and a heating step of heat-softening the low-melting-point metal of the ground member to connect the low-melting-point metal of the ground member to the shielding layer of the shielding film.

12. The method for producing a shielded printed wiring board according to claim 11, wherein the pressurizing step and the heating step are simultaneously performed.

13. The method for producing a shielded printed wiring board according to claim 11, wherein the shielding film comprises an adhesive layer, the shielding layer laminated on the adhesive layer, and the insulating layer laminated on the shielding layer.

14. The method for producing a shielded printed wiring board according to claim 13, wherein the adhesive layer of the shielding film is a conductive adhesive layer.

15. The method for producing a shielded printed wiring board according to claim 13, wherein the shielding layer of the shielding film is made of metal.

16. The method for producing a shielded printed wiring board according to claim 13, wherein
the shielding film comprises a shielding film low-melting-point metal layer between the adhesive layer and the shielding layer and/or between the shielding layer and the insulating layer, and
in the heating step, the shielding film low-melting-point metal layer is softened to be connected to the core particles of the ground member.

17. The method for producing a shielded printed wiring board according to claim 11, wherein the shielding layer of the shielding film is a conductive adhesive layer.

18. The method for producing a shielded printed wiring board according to claim 17, wherein
the shielding film comprises a shielding film low-melting-point metal layer between the shielding layer and the insulating layer, and
in the heating step, the shielding film low-melting-point metal layer is softened to be connected to the core particles of the ground member.

19. A shielded printed wiring board comprising:
a substrate film sequentially including a base film, a printed circuit including a ground circuit, and an insulating film;
a shielding film including a shielding layer and an insulating layer laminated on the shielding layer, the shielding film covering the substrate film such that the shielding layer is closer to the substrate film than the insulating layer is; and
a ground member mounted on the insulating layer of the shielding film, the ground member including:
a conductive external connection member having a first main surface and a second main surface opposite to the first main surface;
conductive filler particles disposed adjacent to the first main surface; and
an adhesive resin for fixing the conductive filler particles to the first main surface,
wherein the conductive filler particles comprise a low-melting-point metal,
the conductive filler particles of the ground member are disposed penetrating the insulating layer of the shielding film,
the low-melting-point metal in the conductive filler particles of the ground member is connected to the shielding layer of the shielding film,
the external connection member of the ground member is electrically connectable to an external ground,
the conductive filler particles each comprise a core particle and a low-melting-point metal layer made of the low-melting-point metal that is formed on at least a portion of a surface of the core particle, and
the core particle is at least one selected from the group consisting of nickel powder, silver-coated nickel powder, and gold-coated nickel powder.

20. The shielded printed wiring board according to claim 19, wherein
the shielding film comprises an adhesive layer, the shielding layer laminated on the adhesive layer, and the insulating layer laminated on the shielding layer, and
the adhesive layer of the shielding film is in contact with the substrate film.

21. The shielded printed wiring board according to claim 20, wherein the adhesive layer of the shielding film is a conductive adhesive layer.

22. The shielded printed wiring board according to claim 20, wherein the shielding layer of the shielding film is made of metal.

23. The shielded printed wiring board according to claim 20, wherein
the shielding film comprises a shielding film low-melting-point metal layer between the adhesive layer and the shielding layer and/or between the shielding layer and the insulating layer, and
the shielding film low-melting-point metal layer is connected to the conductive filler particles of the ground member.

24. The shielded printed wiring board according to claim 19, wherein
the shielding layer of the shielding film is a conductive adhesive layer, and
the conductive adhesive layer of the shielding film is in contact with the substrate film.

25. The shielded printed wiring board according to claim 24, wherein
the shielding film comprises a shielding film low-melting-point metal layer between the shielding layer and the insulating layer, and
the shielding film low-melting-point metal layer is connected to the conductive filler particles of the ground member.

* * * * *